United States Patent
Mo et al.

(10) Patent No.: US 11,158,790 B2
(45) Date of Patent: *Oct. 26, 2021

(54) RESISTIVE RANDOM ACCESS MEMORY DEVICE

(71) Applicant: Taiwan Semiconductor Manufacturing Co., Ltd., Hsin-Chu (TW)

(72) Inventors: Chun-Chieh Mo, Kaohsiung (TW); Shih-Chi Kuo, Yangmei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/901,450

(22) Filed: Jun. 15, 2020

(65) Prior Publication Data

US 2020/0313086 A1 Oct. 1, 2020

Related U.S. Application Data

(63) Continuation of application No. 16/123,519, filed on Sep. 6, 2018, now Pat. No. 10,686,129.

(60) Provisional application No. 62/592,318, filed on Nov. 29, 2017.

(51) Int. Cl.
*H01L 27/22* (2006.01)
*H01L 27/24* (2006.01)
*H01L 45/00* (2006.01)

(52) U.S. Cl.
CPC ........ *H01L 45/1253* (2013.01); *H01L 27/222* (2013.01); *H01L 27/249* (2013.01); *H01L 27/2463* (2013.01); *H01L 45/04* (2013.01); *H01L 45/085* (2013.01); *H01L 45/122* (2013.01); *H01L 45/1233* (2013.01); *H01L 45/14* (2013.01); *H01L 45/143* (2013.01); *H01L 45/146* (2013.01); *H01L 45/147* (2013.01); *H01L 45/1675* (2013.01);
(Continued)

(58) Field of Classification Search
CPC . H01L 45/1253; H01L 27/249; H01L 45/122; H01L 45/143; H01L 45/14; H01L 45/085; H01L 27/222; H01L 45/04; H01L 45/1233; H01L 27/2463; H01L 45/147; H01L 45/1675; H01L 45/146; H01L 27/2436; H01L 45/1625; H01L 45/1616; H01L 45/12
See application file for complete search history.

(56) References Cited

U.S. PATENT DOCUMENTS

| | | |
|---|---|---|
| 2010/0003767 A1 | 1/2010 | Cho |
| 2010/0109065 A1 | 5/2010 | Oh et al. |
| 2013/0077379 A1 | 3/2013 | Matsudaira et al. |

(Continued)

FOREIGN PATENT DOCUMENTS

| | | |
|---|---|---|
| KR | 1020130033325 A | 4/2013 |
| KR | 1020150133658 A | 11/2015 |
| KR | 1020170085411 A | 7/2017 |

*Primary Examiner* — David Vu
(74) *Attorney, Agent, or Firm* — Duane Morris LLP

(57) ABSTRACT

A memory cell includes: a first electrode contact formed as a cylinder shape that extends along a first direction; a resistive material layer comprising a first portion that extends along the first direction and surrounds the first electrode contact; and a second electrode contact coupled to the resistive material layer, wherein the second electrode contact surrounds the first electrode contact and the first portion of the resistive material layer.

20 Claims, 21 Drawing Sheets

(52) U.S. Cl.
CPC ...... *H01L 27/2436* (2013.01); *H01L 45/1616* (2013.01); *H01L 45/1625* (2013.01)

(56) References Cited

U.S. PATENT DOCUMENTS

| | | |
|---|---|---|
| 2013/0240821 A1 | 9/2013 | Toh et al. |
| 2015/0021675 A1 | 1/2015 | Min |
| 2015/0340406 A1 | 11/2015 | Jo |
| 2016/0308128 A1 | 10/2016 | Liu et al. |
| 2017/0207387 A1 | 7/2017 | Yang et al. |

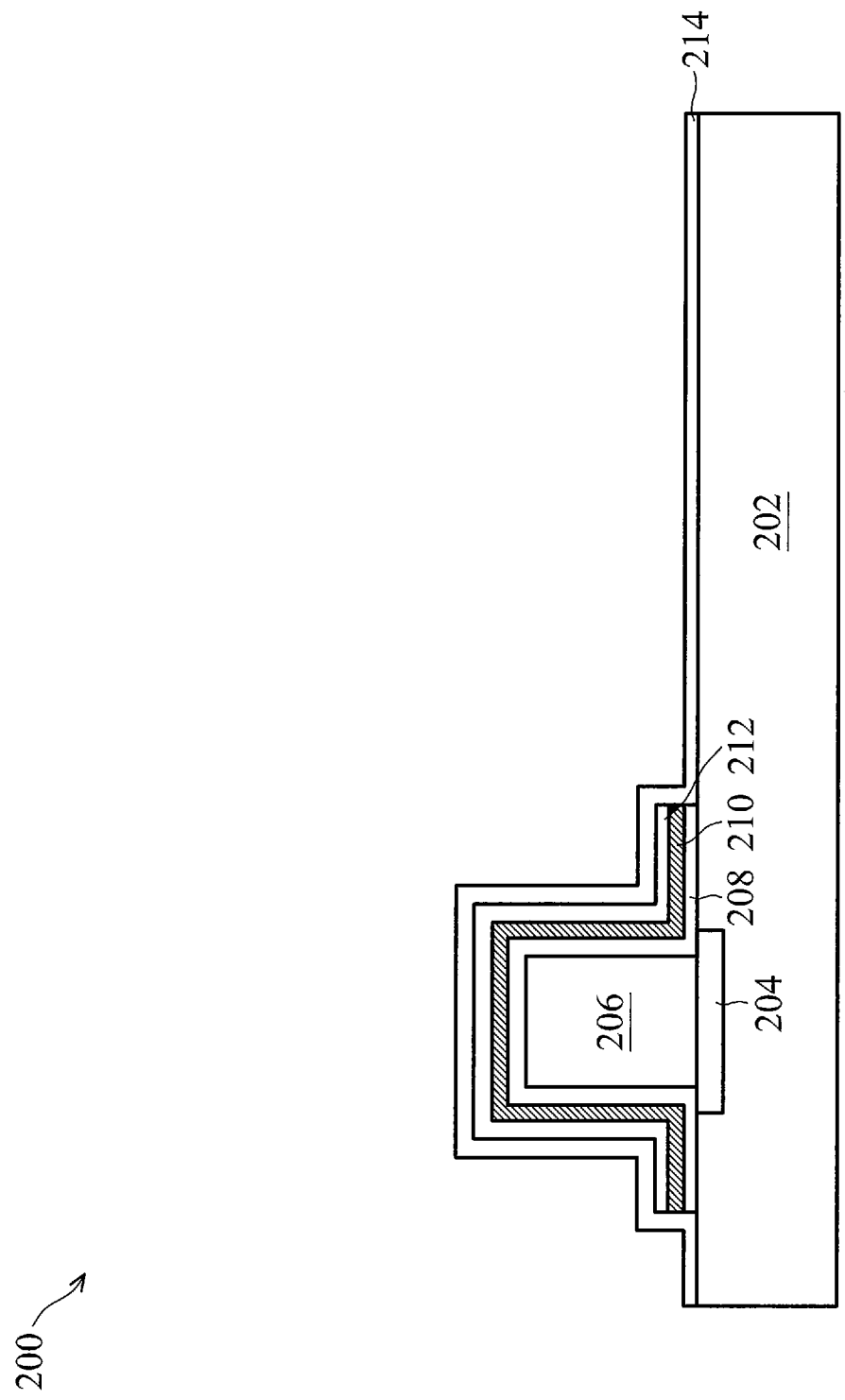

RESISTIVE RANDOM ACCESS MEMORY DEVICE

CROSS-REFERENCE TO RELATED APPLICATION

This application is a continuation application of U.S. patent application Ser. No. 16/123,519, filed Sep. 6, 2018, which claims priority to U.S. Provisional Patent Application No. 62/592,318, filed on Nov. 29, 2017, each of which are incorporated by reference herein in their entireties.

BACKGROUND

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state and a low resistance state, have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

As integrated circuit (IC), including such RRAM devices, has been desired to be more powerful, a number of the RRAM devices in the IC is desired to be maximized accordingly. Generally, an RRAM device includes a top electrode (e.g., an anode) and a bottom electrode (e.g., a cathode) with a variable resistive material layer interposed therebetween. Forming the RRAM device in such a stack configuration may encounter a limit in terms of maximizing the number of the RRAM devices in the IC since the number can only be increased two-dimensionally. Alternatively stated, within a given area on the IC, the number of the RRAM devices may be substantially limited. Thus, existing RRAM devices and methods to make the same are not entirely satisfactory.p

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIGS. 2A, 2B, 2C, 2D, 2E, 2F, 2G, 2H, 2I, 2J, 2K, 2L, 2M, 2N, and 2O illustrate cross-sectional views of an exemplary semiconductor device during various fabrication stages, made by the method of FIG. 1, in accordance with some embodiments.

DETAILED DESCRIPTION OF EMBODIMENTS

Figure 1A:
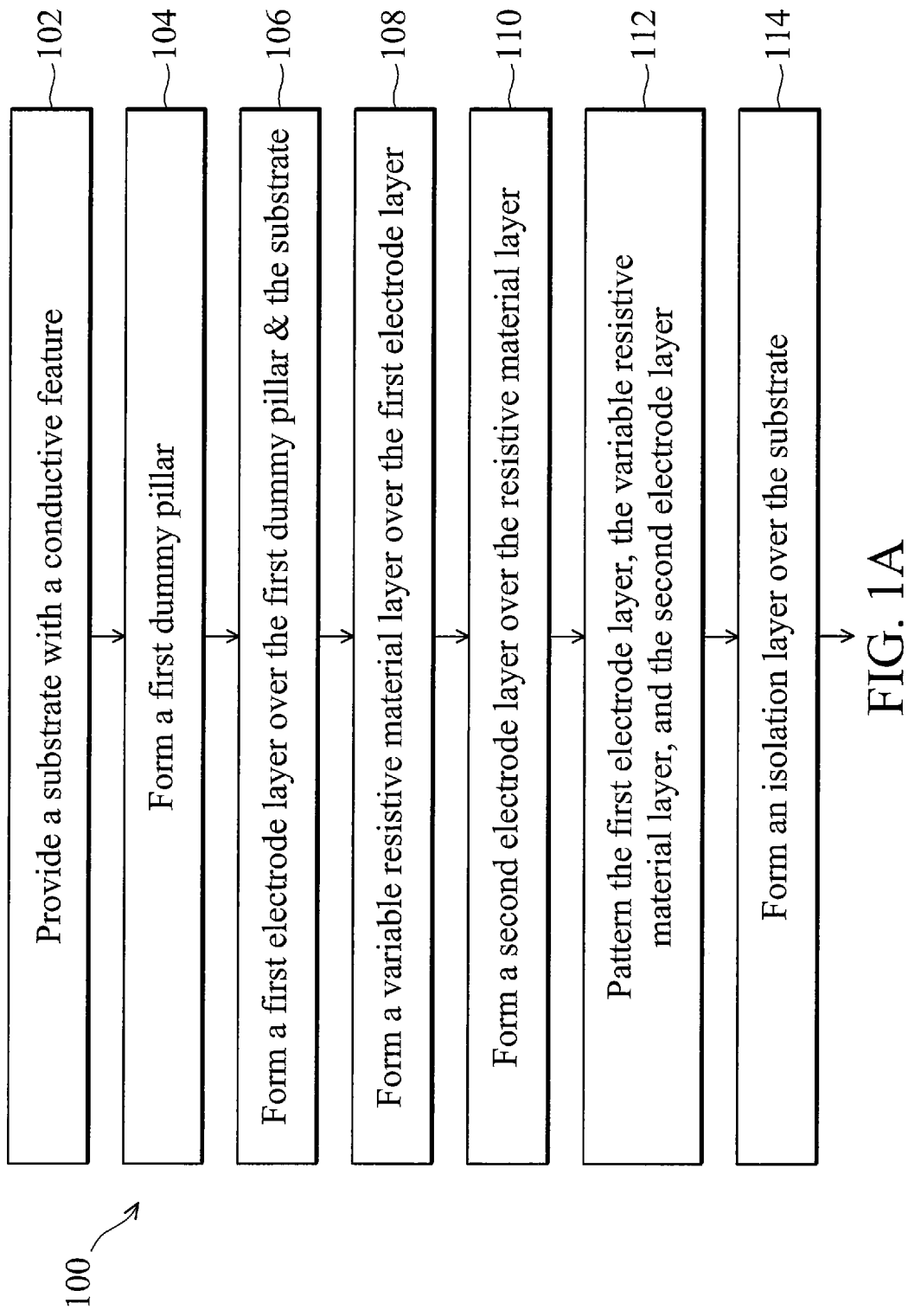
FIGS. 1A-1C illustrate a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a novel RRAM device and methods to form the same. In some embodiments, the disclosed RRAM device includes a plurality of RRAM bit cells that can be integrated three-dimensionally, i.e., both laterally and vertically. For example, a subset of the plurality of RRAM bit cells are integrated vertically, and plural such subsets can be further integrated laterally to form a three-dimensionally integrated RRAM device. More particularly, in some embodiments, along one of such integration columns, a common electrode contact is formed so as to have a cylinder shape, and each of a plurality of RRAM bit cells integrated along the integration column includes a respective variable resistive material layer surrounding a respective portion of the common electrode contact and a respective horizontal electrode contact. As such, a first plurality of RRAM bit cells can be integrated vertically through the common electrode contact while, in the meantime, a second plurality of RRAM bit cells can be integrated laterally through the horizontal electrode contact.

Figure 1B:
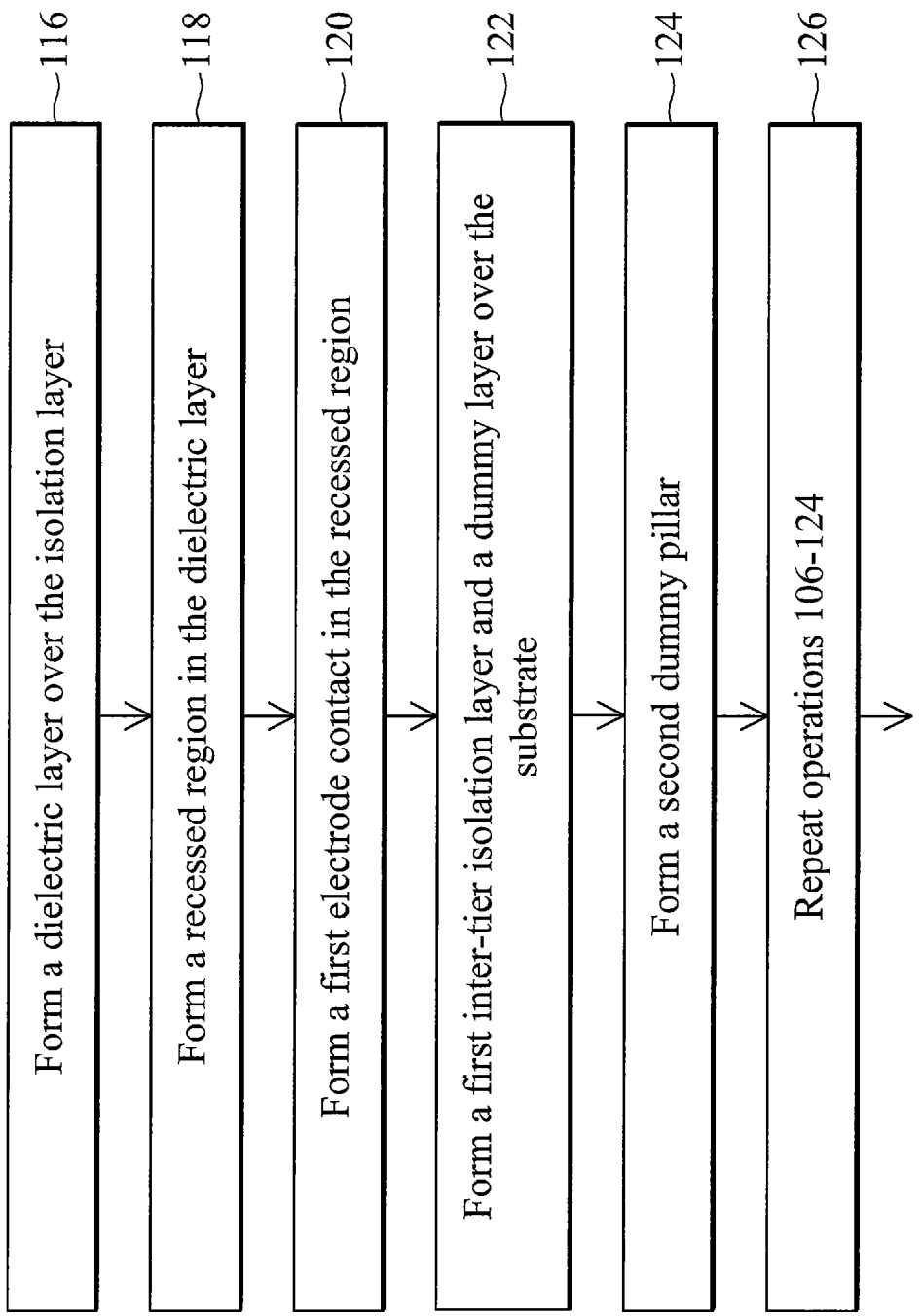
Figure 1C:
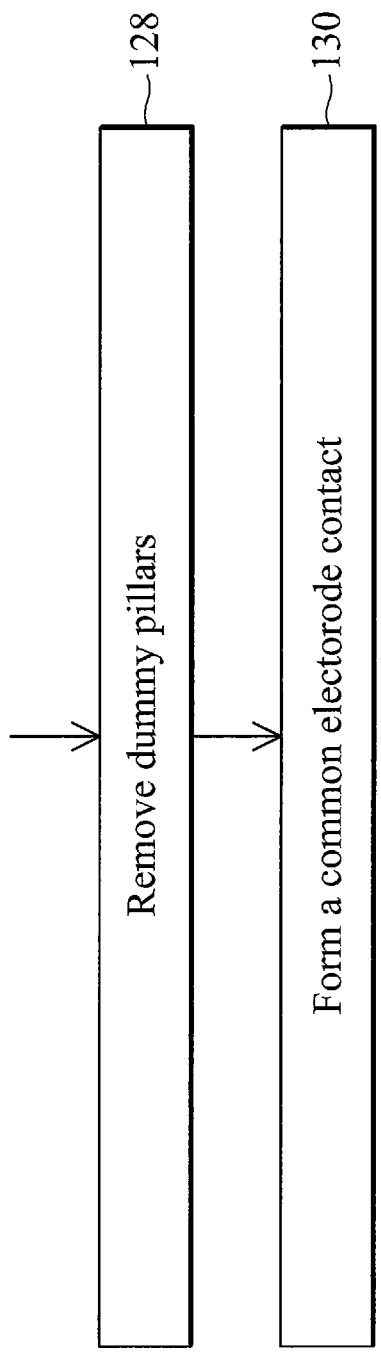

FIGS. 1A, 1B, and 1C illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, an RRAM device. As employed by the present disclosure, the RRAM device refers to any device including a variable resistive material layer. It is understood that the method 100 of FIGS. 1A, 1B, and 1C does not produce a completed RRAM device. A completed RRAM device may be fabricated using complementary metal-oxide-semiconductor (CMOS) technology processing. Accordingly, it is understood that additional operations may be provided before, during, and after the method 100 of FIGS. 1A, 1B, and 1C, and that some other operations may only be briefly described herein.

Referring first to FIG. 1A, in some embodiments, the method 100 starts with operation 102 in which a substrate with at least a conductive feature (e.g., a source, drain, and/or gate electrode of a transistor) is provided. The method 100 continues to operation 104 in which a first dummy cylinder is formed. In some embodiments, the first dummy cylinder is aligned with (e.g., coupled to) the conductive feature. In some embodiments, the first dummy cylinder extends along a vertical direction, perpendicular to a major surface of the substrate, such that a corner may be formed at an intersection of a sidewall of the first dummy cylinder and the major surface of the substrate. Further, when viewed from the top, the first dummy cylinder has a cross-section in one of a variety of shapes, for example, a circle, a polygon, etc., in accordance with some embodiments.

The method 100 continues to operation 106 in which a first electrode layer is formed over the first dummy cylinder and the substrate. The method 100 continues to operation 108 in which a variable resistive material layer is formed over the first electrode layer. The method 100 continues to operation 110 in which a second electrode layer is formed over the variable resistive material layer. In some embodiments, the first electrode layer, the variable resistive material layer, and the second electrode layer, formed at operations 106, 108, and 110, respectively, are each substantially conformal and thin. As such, each of the first electrode layer, the variable resistive material layer, and the second electrode layer may surround the first dummy cylinder, and more specifically, may follow a profile of the aforementioned corner, which will be discussed in further detail below. The method 100 continues to operation 112 in which the first electrode layer, the variable resistive material layer, and the second electrode layer are patterned. As such, part of the major surface of the substrate is re-exposed. The method 100 continues to operation 114 in which an isolation layer is formed over the substrate. In some embodiments, the isolation layer overlays a top surface of the second electrode layer, which includes a concave portion, and further overlays the re-exposed major surface of the substrate.

Referring then to FIG. 1B, the method 100 continues to operation 116 in which a dielectric layer is formed over the first isolation layer. In some embodiments, an optional anti-reflective coating (ARC) layer may be formed over the dielectric layer. The method 100 continues to operation 118 in which a recessed region is formed within the dielectric layer. In some embodiments, forming such a recessed region may re-expose a portion of the top surface of the second electrode layer that includes the above-mentioned concave portion. The method 100 continues to operation 120 in which a first electrode contact is formed in the recessed region. In some embodiments, the first electrode contact is formed by refilling the recessed region with a conductive material (e.g., copper (Cu)). Accordingly, the first electrode contact is coupled to the concave portion of the second electrode layer, and when viewed form the top, the first electrode contact surrounds the second electrode layer.

In accordance with some embodiments of the present disclosure, from the operations 104 to 120, a first RRAM resistor may be partially formed. Alternatively stated, the first partially formed RRAM resistor includes the first electrode layer, first variable resistive material layer, and second electrode layer, and the first electrode contact, all of which are formed in a single tier. Accordingly, in some embodiments, this tier where the first partially formed RRAM resistor (and subsequently a first completed RRAM resistor) is formed is herein referred to as a "first tier."

The method 100 continues to operation 122 in which a first inter-tier isolation layer and a dummy layer are formed over the substrate. In some embodiments, the first inter-tier isolation layer may be first formed over the re-exposed top surface of the first dummy cylinder and the first electrode contact, and the dummy layer is then formed over the first inter-tier isolation layer. The method 100 continues to operation 124 in which a second dummy cylinder is formed. In some embodiments, the second dummy cylinder is formed by patterning the dummy layer, and vertically aligned with the first dummy cylinder. The method 100 continues to operation 126 in which the operations 106 to 124 are repeated. As such, in some embodiments, one or more partially formed RRAM bit cells may be formed in respective "tiers" above the first tier, wherein each of the one or more partially formed RRAM bit cells includes a respective dummy cylinder surrounded by respective first electrode layer, variable resistive material layer, and second electrode layer, and a respective first electrode contact, which will be discussed in further detail below.

Referring then to FIG. 1C, the method 100 continues to operation 128 in which the first and subsequently formed dummy cylinders are removed. In some embodiments, the dummy cylinders formed in respective tiers are removed such that the conductive feature in the substrate and respective inner sidewalls of the first electrode layers across the tiers are re-exposed. The method 100 continues to operation 130 in which a common electrode contact is formed. In some embodiments, the common electrode contact may serve as a respective second electrode contact for each of the RRAM bit cells across the tiers.

Figure 2A:
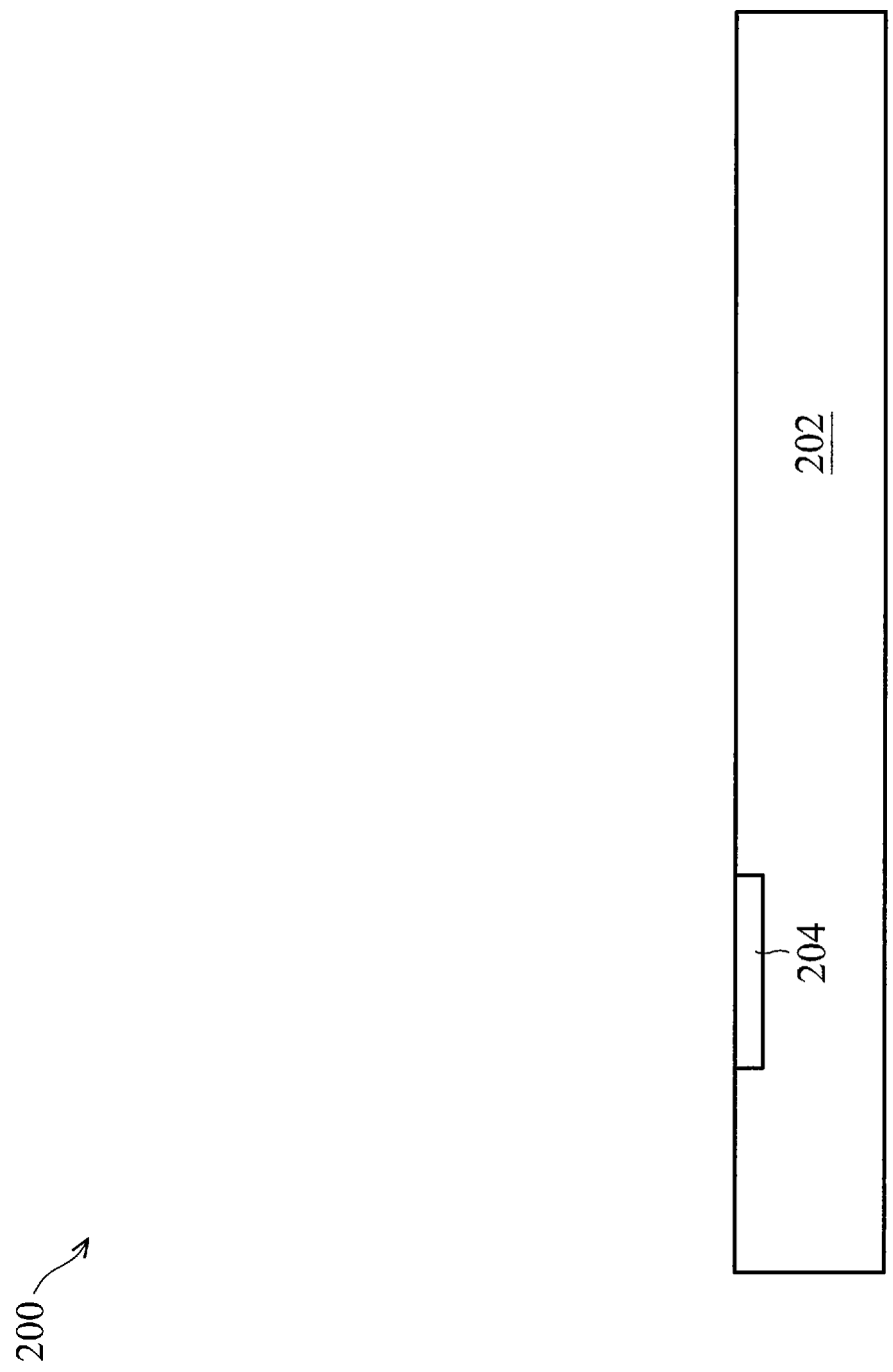

In some embodiments, operations of the method 100 may be associated with cross-sectional views of a semiconductor device 200 at various fabrication stages as shown in FIGS. 2A, 2B, 2C, 2D, 2E, 2F, 2G, 2H, 2I, 2J, 2K, 2L, 2M, 2N, and 2O, respectively. In some embodiments, the semiconductor device 200 may be RRAM device. The RRAM device 200 may be included in a microprocessor, memory cell, and/or other integrated circuit (IC). Also, FIGS. 2A through 2O are simplified for a better understanding of the concepts of the present disclosure. For example, although the figures illustrate the RRAM device 200, it is understood the IC, in which the RRAM device 200 is formed, may include a number of other devices comprising resistors, capacitors, inductors, fuses, etc., which are not shown in FIGS. 2A through 2O, for purposes of clarity of illustration.

Corresponding to operation 102 of FIG. 1A, FIG. 2A is a cross-sectional view of the RRAM device 200 including a substrate 202 with a conductive feature 204, which is provided, at one of the various stages of fabrication, according to some embodiments. Although the RRAM device 200 in the illustrated embodiment of FIG. 2A includes only one conductive feature 204, it is understood that the illustrated embodiment of FIG. 2A and the following figures are merely provided for illustration purposes. Thus, the RRAM device 200 may include any desired number of conductive features while remaining within the scope of the present disclosure.

In some embodiments, the substrate 202 includes a semiconductor material substrate, for example, silicon. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In the above-described embodiment where the substrate 202 includes a semiconductor material, the conductive feature 204 may be a source, drain, or gate electrode of a transistor. Alternatively, the conductive feature 204 may be a silicide feature disposed on the source, the drain or the gate electrode. The silicide feature may be formed by a self-aligned silicide (typically known as "silicide") technique.

In some other embodiments, the substrate 202 is a dielectric material substrate formed over various device features (e.g., a source, drain, or gate electrode of a transistor). Such a dielectric material substrate 202 may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

In such an embodiment where the substrate 202 includes a dielectric material, the conductive feature 204 may be a horizontal or vertical conductive structure formed within the substrate 202. Typically, the substrate 202 may be referred to as an "initial metallization layer" or an "initial tier." For example, the conductive feature 204 may be an interconnection structure (i.e., a horizontal conductive structure), or a via structure (i.e., a vertical conductive structure). Accordingly, the conductive feature 204 may be electrically coupled to a device feature of a transistor, for example, a source, drain, or gate feature of the transistor that is disposed below the tier where the substrate 202 is provided. In some embodiments, the conductive feature 204 may be formed of a metal material (e.g., copper (Cu), aluminum (Al), tungsten (W), etc.).

Figure 2B:
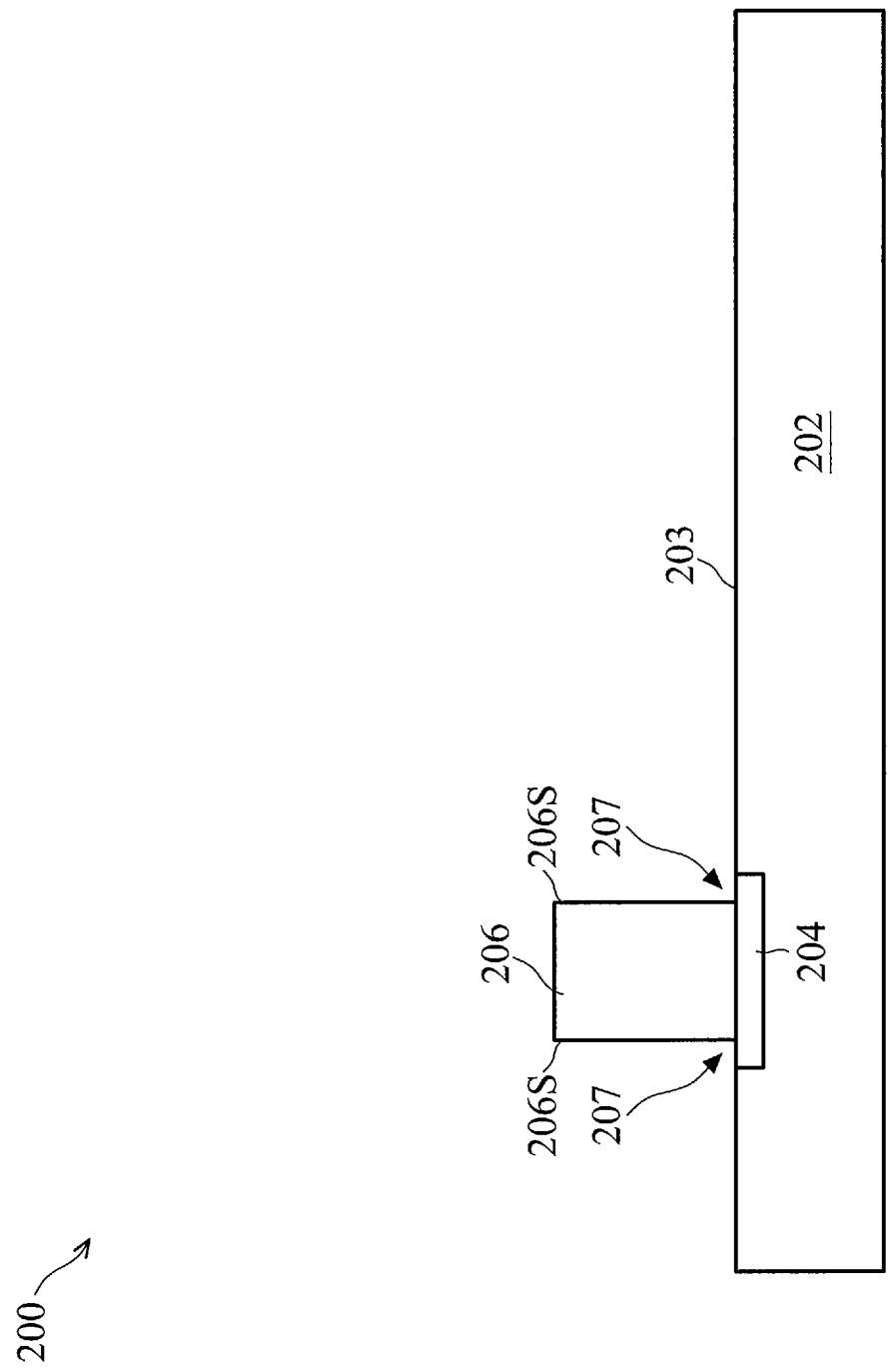

Corresponding to operation 104 of FIG. 1A, FIG. 2B is a cross-sectional view of the RRAM device 200 including a first dummy cylinder 206, which is formed, at one of the various stages of fabrication, according to some embodiments. As shown, the first dummy cylinder 206 protrudes beyond a major surface 203 of the substrate 202 and extends along a vertical direction, perpendicular to the major surface 203 of the substrate 202. Thus, in some embodiments, a corner 207 may be formed at an intersection of a sidewall 206S of the first dummy cylinder 206 and the major surface 203 of the substrate 202. Further, in some embodiments, the first dummy cylinder 206 is laterally aligned with the conductive feature 204 such that at least a portion of the first dummy cylinder 206 is formed to directly contact the conductive feature 204.

In some embodiments, the first dummy cylinder 206 may include a cross-section in any of a variety of shapes, e.g., a circle, a polygon, etc. Alternatively stated, when viewed from the top, the first dummy cylinder 206 presents one of the above-mentioned shapes. Accordingly, in some embodiments, the corner 207, surrounding the first dummy cylinder 206, may follow the shape of the first dummy cylinder 206, which will be discussed in further detail below. In some embodiments, the first dummy cylinder 206 may have an aspect ratio (width/height) of about 0.01 to about 0.5. In an example where the first dummy cylinder 206 has a circular cross-section, the first dummy cylinder 206 may have a diameter of about 10 nm to about 70 nm, and a height of about 200 nm.

In some embodiments, the first dummy cylinder 206 may be formed of an oxide material (e.g., silicon oxide). In some embodiments, the first dummy cylinder 206 is formed by performing at least some of the following processes: using chemical vapor deposition (CVD), high-density plasma (HDP) CVD, physical vapor deposition (PVD), spin-on coating, and/or other suitable techniques to deposit the oxide material over the substrate 202 and the conductive feature 204; and performing one or more patterning processes (e.g., a lithography process, a dry/wet etching process, a cleaning process, a soft/hard baking process, etc.) to form the first dummy cylinder 206.

Figure 2C:
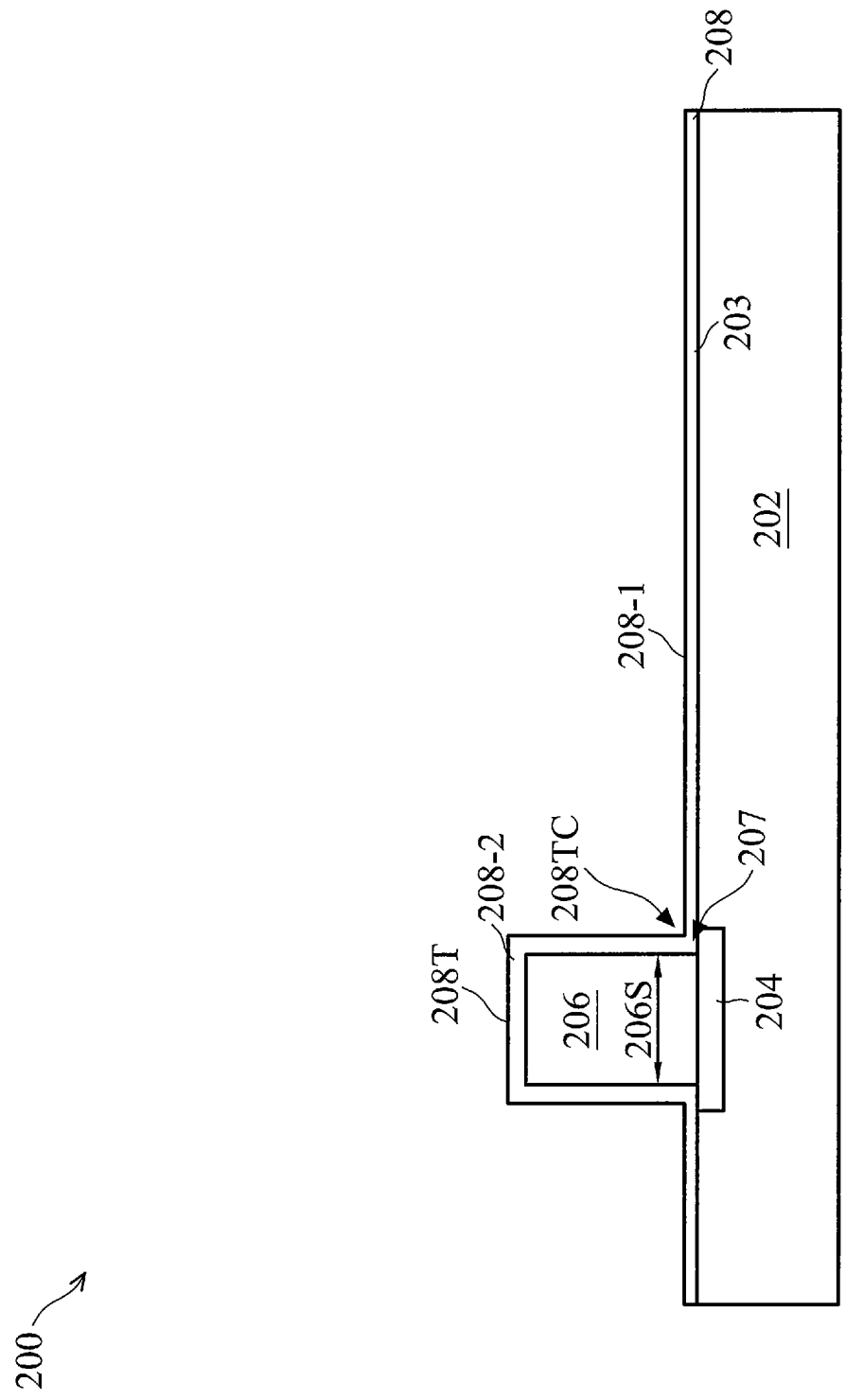

Corresponding to operation 106 of FIG. 1A, FIG. 2C is a cross-sectional view of the RRAM device 200 including a first electrode layer 208, which is formed, at one of the various stages of fabrication, according to some embodiments. As shown, the first electrode layer 208 is formed to overlay the major surface 203 of the substrate 202 and the first dummy cylinder 206. In some embodiments, the first electrode layer 208 is substantially conformal and thin (e.g., about 20~50 nm in thickness) so that the first electrode layer 208 may follow a profile of the corner 207, i.e., extending vertically along the sidewall 206S of the first dummy cylinder 206 and horizontally along the major surface 203 of the substrate 202. As such, the first electrode layer 208 includes at least a horizontal portion 208-1 (along the major surface 203) and a vertical portion 208-2 (along the sidewall 206S), causing a top surface 208T of the first electrode layer 208 to present a concave portion 208TC around the corner 207. Further, although the first electrode layer 208 is shown to be coupled to part of the conductive feature 204 in the illustrated embodiment of FIG. 2C, it is noted that the first electrode layer 208 may not be coupled to the conductive feature 204.

In some embodiments, the first electrode layer 208 may be formed from materials such as, for example, gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the first electrode layer 208 is shown as a single layer in the illustrated embodiment of FIG. 2C (and the following figures), it is noted that the first electrode layer 208 may include plural layers formed as a stack, wherein each of the plural layers is formed of one of the above-described materials, e.g., TaN, TiN, etc. In some embodiments, the first electrode layer 208 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the substrate 202 and the conductive feature 204.

Figure 2D:
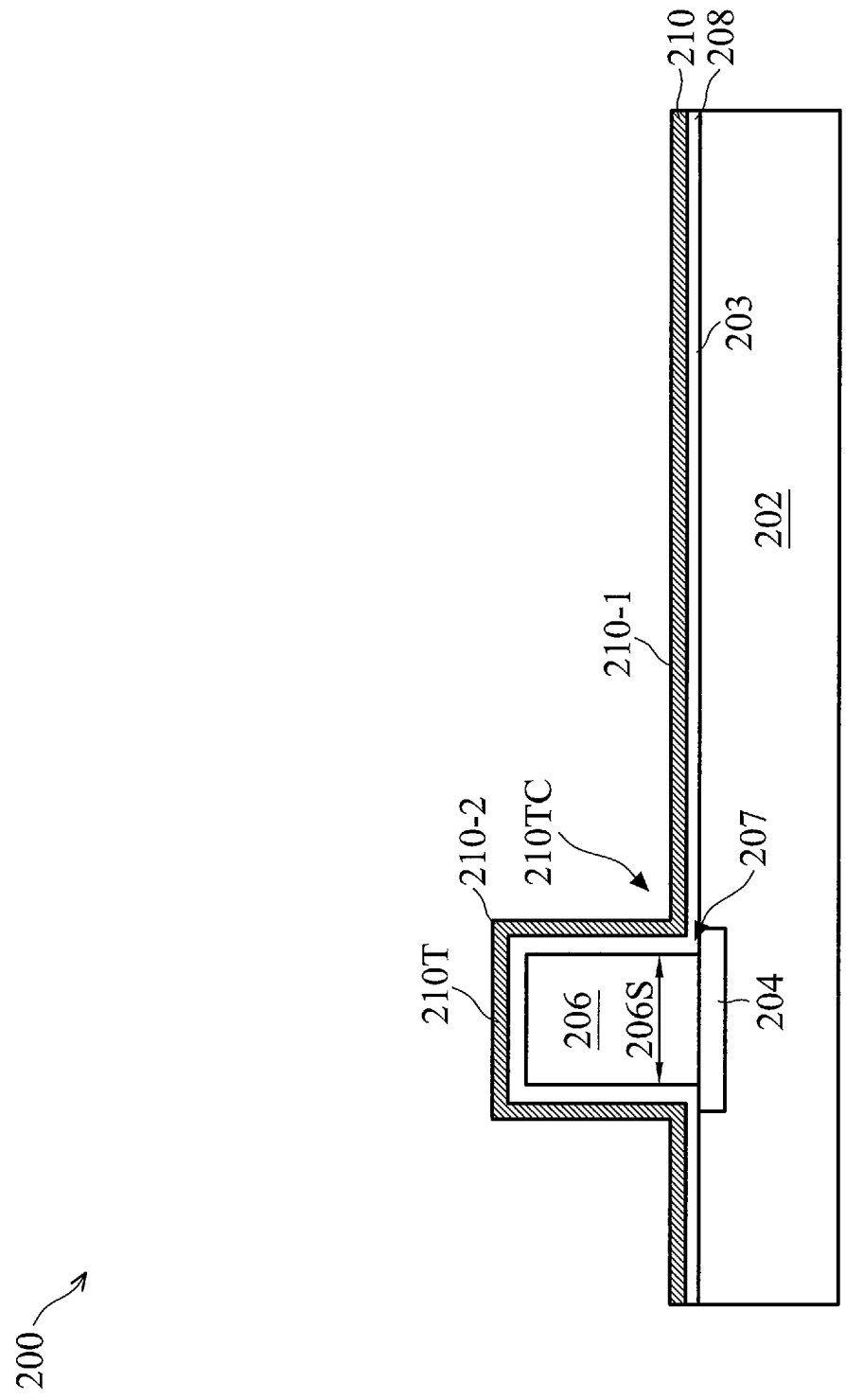

Corresponding to operation 108 of FIG. 1A, FIG. 2D is a cross-sectional view of the RRAM device 200 including a variable resistive material layer 210, which is formed, at one of the various stages of fabrication, according to some embodiments. As shown, the variable resistive material 210 is formed to overlay the first electrode layer 208. In some embodiments, the variable resistive material layer 210 is substantially conformal and thin (e.g., about 2~10 nm in thickness) so that the first variable resistive material layer 208 may still follow the profile of the corner 207, i.e., extending vertically along the sidewall 206S of the first dummy cylinder 206 and horizontally along the major surface 203 of the substrate 202. As such, the variable resistive material layer 210 includes at least a horizontal portion 210-1 (along the major surface 203) and a vertical portion 210-2 (along the sidewall 206S), causing a top surface 210T of the variable resistive material layer 210 to present a concave portion 210TC around the corner 207.

In some embodiments, the variable resistive material layer 210 is a layer having a resistance conversion characteristic (e.g. variable resistance). In other words, the variable resistive material layer 210 includes material characterized to show reversible resistance variance in accordance with a polarity and/or an amplitude of an applied electrical pulse. The variable resistive material layer 210 includes a dielectric layer. The variable resistive material layer 210 may be changed into a conductor or an insulator based on polarity and/or magnitude of electrical signal.

In one embodiment, the variable resistive layer 210 may include a transition metal oxide. The transition metal oxide maybe denoted as $M_xO_y$, where M is a transition metal, O is oxygen, x is the transition metal composition, and y is the oxygen composition. In an embodiment, the variable resistive material layer 210 includes $ZrO_2$. Examples of other materials suitable for the variable resistive material layer 210 include: NiO, $TiO_2$, HfO, ZrO, ZnO, $WO_3$, CoO, $Nb_2O_5$, $Fe_2O_3$, CuO, $CrO_2$, $SrZrO_3$ (Nb-doped), and/or other materials known in the art. In another embodiment, the variable resistive layer 210 may include a colossal magnetoresistance (CMR)-based material such as, for example, $Pr_{0.7}Ca_{0.3}$, $MnO_3$, etc.

In yet another embodiment, the variable resistive layer 210 may include a polymer material such as, for example, polyvinylidene fluoride and poly[(vinylidenefluoride-co-trifluoroethylene] (P(VDF/TrFE)). In yet another embodiment, the variable resistive layer 210 may include a conductive-bridging random access memory (CBRAM) material such as, for example, Ag in GeSe. According to some embodiments, the variable resistive material layer 210 may include multiple layers having characteristics of a resistance conversion material. A set voltage and/or a reset voltage of the variable resistive material layer 210 may be determined by the variable resistive material layer 210's compositions (including the values of "x" and "y"), thickness, and/or other factors known in the art.

In some embodiments, the variable resistive material layer 210 may be formed by an atomic layer deposition (ALD) technique with a precursor containing a metal and oxygen. In some embodiments, other chemical vapor deposition (CVD) techniques may be used. In some embodiments, the variable resistive material layer 210 may be formed by a physical vapor deposition (PVD) technique, such as a sputtering process with a metallic target and with a gas supply of oxygen and optionally nitrogen to the PVD chamber. In some embodiments, the variable resistive material layer 210 may be formed by an electron-beam deposition technique.

Figure 2E:
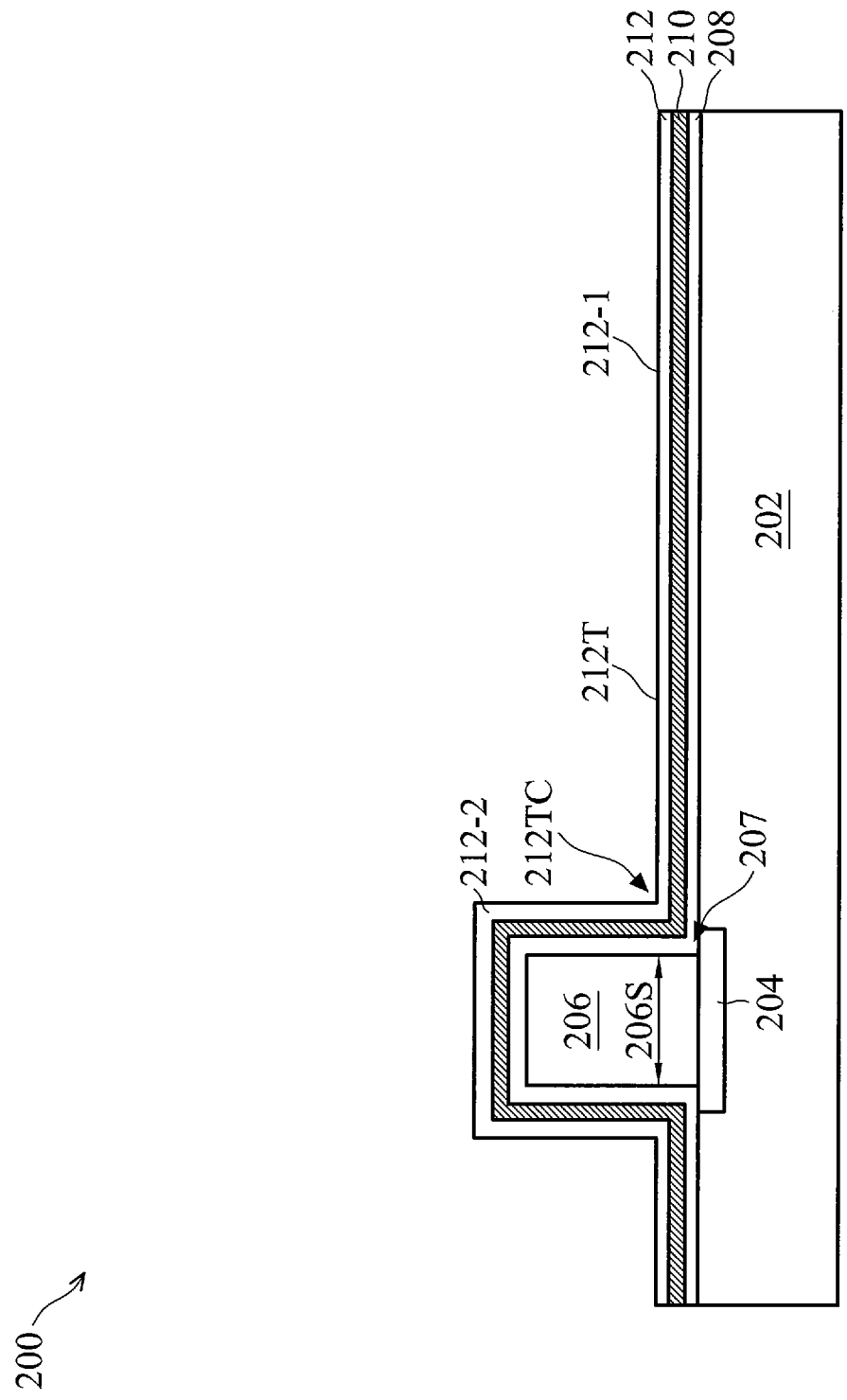

Corresponding to operation 110 of FIG. 1A, FIG. 2E is a cross-sectional view of the RRAM device 200 including a second electrode layer 212, which is provided, at one of the various stages of fabrication, according to some embodiments. As shown, the second electrode layer 212 is formed to overlay the variable resistive material layer 210. In some embodiments, the second electrode layer 212 is substantially conformal and thin (e.g., about 20~50 nm in thickness) so that the second electrode layer 212 may still follow the profile of the corner 207, i.e., extending vertically along the sidewall 206S of the first dummy cylinder 206 and horizontally along the major surface 203 of the substrate 202. As such, the second electrode layer 212 includes at least a horizontal portion 212-1 (along the major surface 203) and a vertical portion 212-2 (along the sidewall 206S), causing a top surface 212T of the second electrode layer 212 to present a concave portion 212TC around the corner 207.

In some embodiments, the second electrode layer may be formed of a substantially similar material of the first electrode layer 208. Thus, the second electrode layer 212 may be formed from materials such as, for example, gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the second electrode layer 212 is shown as a single layer in the illustrated embodiment of FIG. 2E (and the following figures), it is noted that the first electrode layer 208 may include plural layers formed as a stack, wherein each of the plural layers is formed of one of the above-described materials, e.g., TaN, TiN, etc. In some embodiments, the second electrode layer 212 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the variable resistive material layer 210.

Figure 2F:
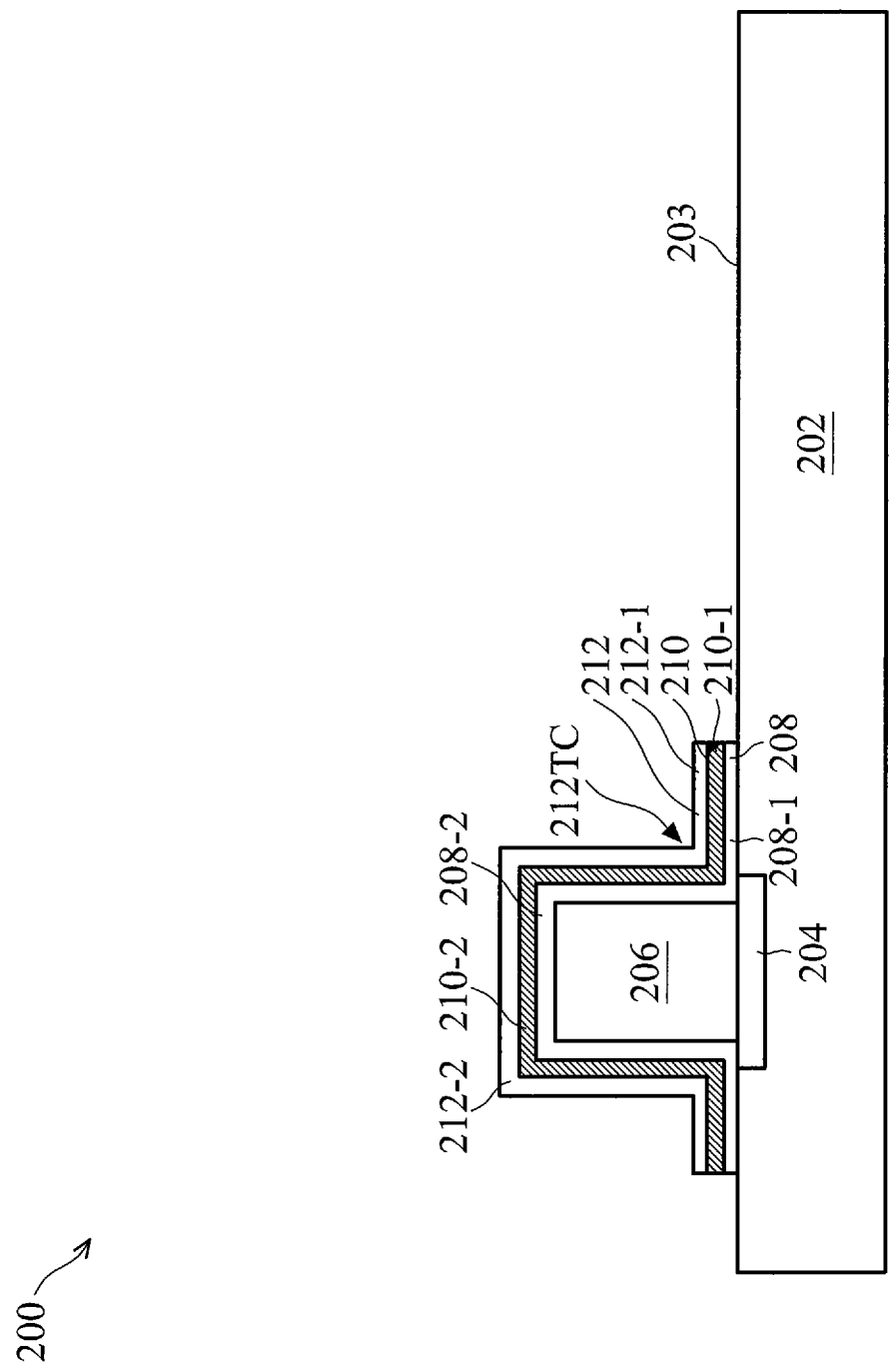

Corresponding to operation 112 of FIG. 1A, FIG. 2F is a cross-sectional view of the RRAM device 200 in which the first electrode layer 208, the variable resistive material layer 210, and the second electrode layer 212 are patterned, at one of the various stages of fabrication, according to some embodiments. According to some embodiments, the first electrode layer 208, the variable resistive material layer 210, and the second electrode layer 212 are patterned to leave respective vertical portions and part of respective horizontal portions intact.

More specifically, in some embodiments, the vertical portions 208-2 of the first electrode layer 208, the vertical portion 210-2 of the variable resistive material layer 210, and the vertical portion 212-2 of the second electrode layer 212, respectively, remain intact. And part of the horizontal portion 208-1 of the first electrode layer 208, e.g., a horizontal portion coupled and relatively closer to the vertical portion 208-2, remains intact (hereinafter "remaining horizontal portion 208-1"); part of the horizontal portion 210-1 of the variable resistive material layer 210, e.g., a horizontal portion coupled and relatively closer to the vertical portion 210-2, remains intact (hereinafter "remaining horizontal portion 210-1"); and part of the horizontal portion 212-1 of the second electrode layer 212, e.g., a horizontal portion coupled and relatively closer to the vertical portion 212-2, remains intact (hereinafter "remaining horizontal portion 212-1"). As such, the concave portion 212TC of the second electrode layer 212 may remain intact, and the major surface 203 is re-exposed.

In some embodiments, the patterning process of the first electrode layer 208, the variable resistive material layer 210, and the second electrode layer 212 may include: a deposition process to form a patternable layer (e.g., a photoresist layer) over the substrate 202, a lithography process to define a profile of the patternable layer, a dry/wet etching process to etch respective portions of the first electrode layer 208, the variable resistive material layer 210, and the second electrode layer 212 that are not covered by the defined profile of the patternable layer, a cleaning process, and a soft/hard baking process.

Corresponding to operation 114 of FIG. 1A, FIG. 2G is a cross-sectional view of the RRAM device 200 including an isolation layer 214, which is formed, at one of the various stages of fabrication, according to some embodiments. As shown, the isolation layer 214 is formed to overlay the first electrode layer 208, the variable resistive material layer 210, the second electrode layer 212, and the substrate 202.

In some embodiments, the isolation layer 214 may be silicon carbide, silicon oxynitride, silicon nitride, carbon doped silicon nitride, or carbon doped silicon oxide. The isolation layer 214 is selected to have a different etch selectivity than a dielectric layer 216, which will be discussed below. The isolation layer 214 is deposited over the first electrode layer 208, variable resistive material layer 210, and second electrode layer 212, and the substrate 202 using a chemical vapor deposition (CVD) technique such as a plasma enhanced (PE) CVD, a high-density plasma (HDP) CVD, an inductively-coupled-plasma (ICP) CVD, or a thermal CVD technique.

Figure 2H:
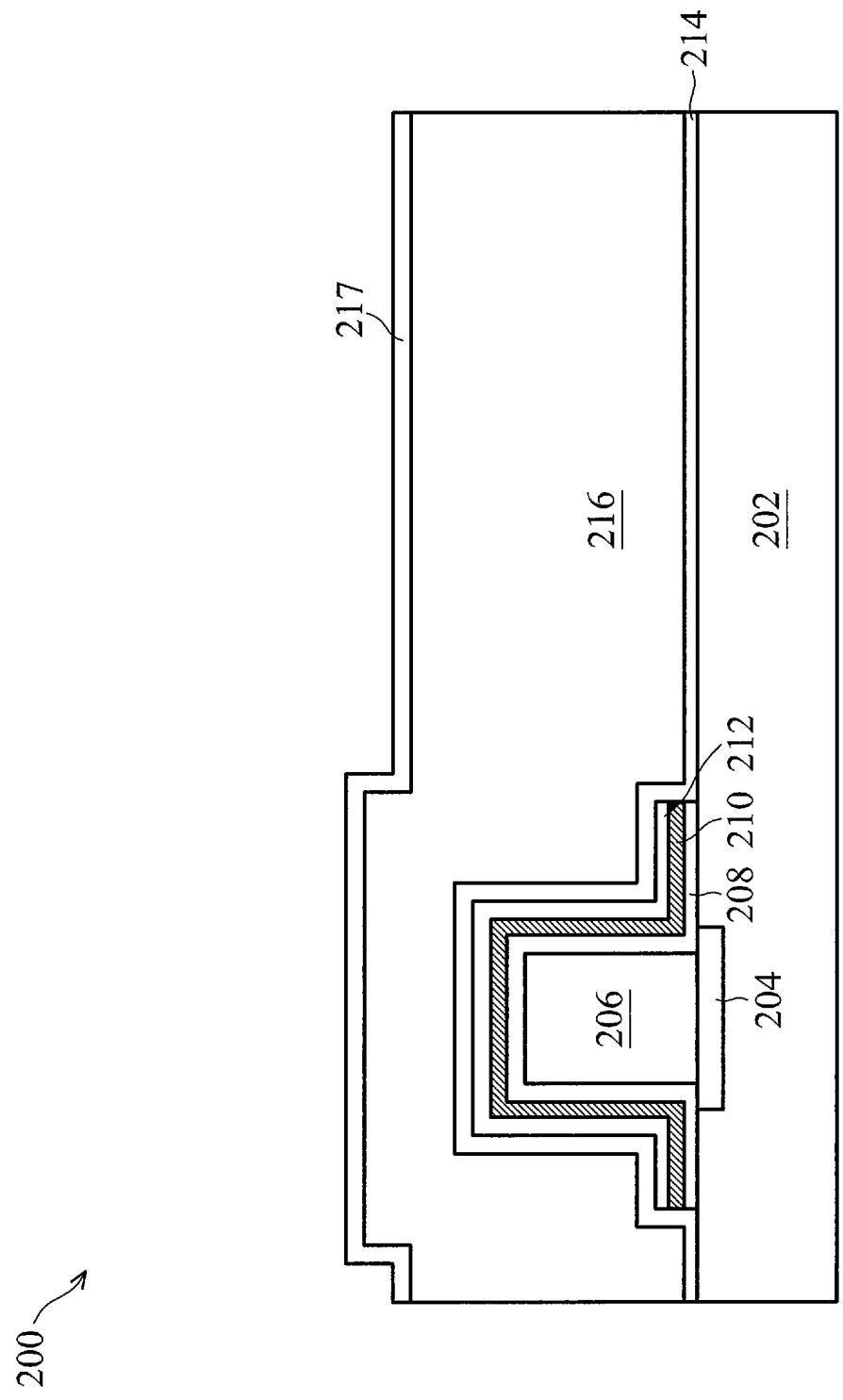

Corresponding to operation 116 of FIG. 1B, FIG. 2H is a cross-sectional view of the RRAM device 200 including a dielectric layer 216, which is formed, at one of the various stages of fabrication, according to some embodiments. As shown, the dielectric layer 216 is formed to overlay the isolation layer 214. In some embodiments, the dielectric layer 216 has a thickness (e.g., about 300~400 nm) that is substantially higher than a height of the first electrode layer 208, variable resistive layer 210, second electrode layer 212, and the isolation layer 214. In some embodiments, an anti-reflective coating (ARC) layer 217 may be optionally formed over the dielectric layer 216.

In some embodiments, the dielectric layer 216 may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the dielectric layer 216 is deposited over the isolation layer 214 using a chemical vapor deposition (CVD) technique such as a plasma enhanced (PE) CVD, a high-density plasma (HDP) CVD, an inductively-coupled-plasma (ICP) CVD, or a thermal CVD technique.

Figure 2I:
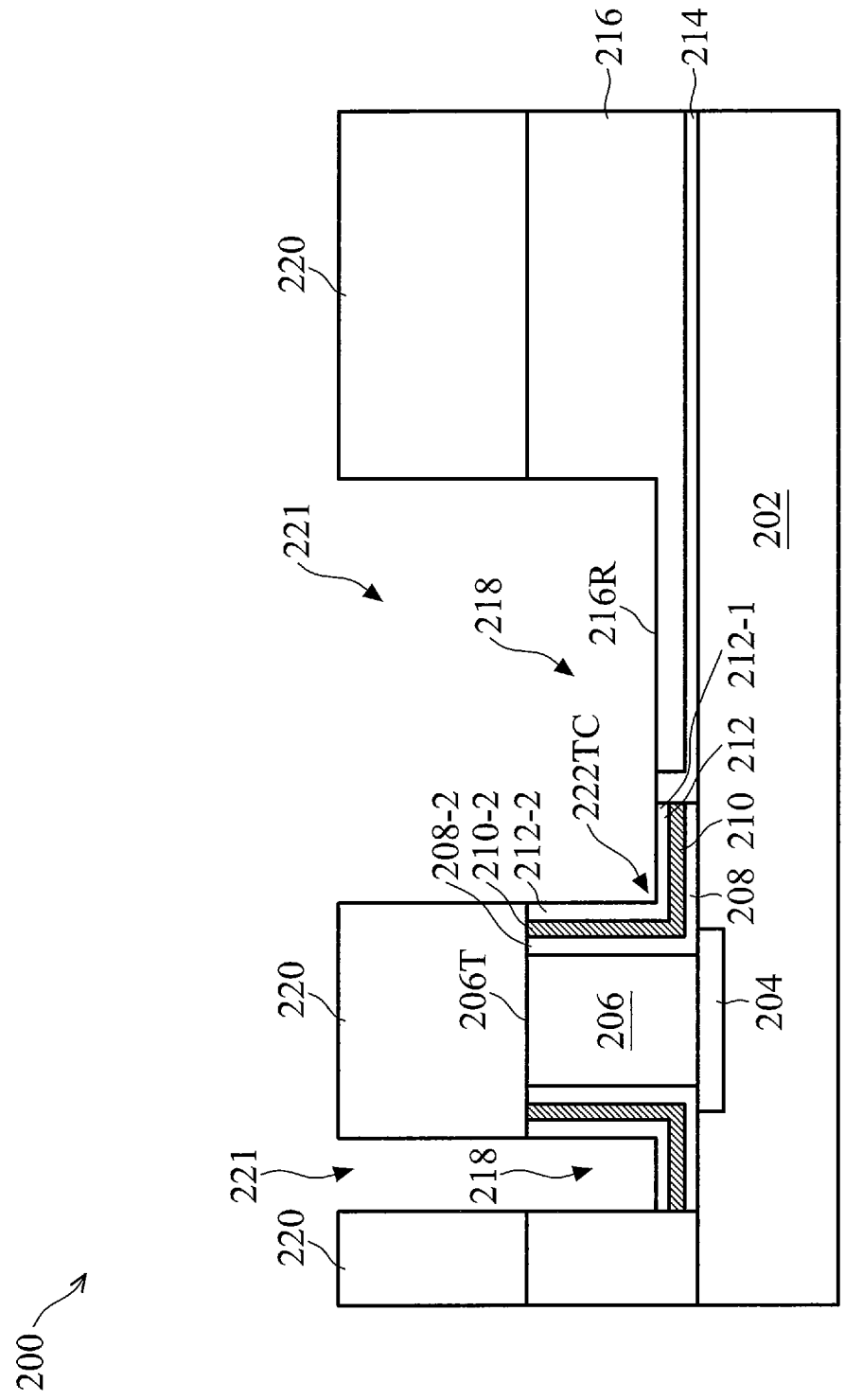

Corresponding to operation 118 of FIG. 1B, FIG. 2I is a cross-sectional view of the RRAM device 200 including a recessed region 218, which is formed, at one of the various stages of fabrication, according to some embodiments. As shown, forming the recessed region 218 re-exposes the concave portion 212TC of the top surface of the second electrode layer 212 (i.e., re-exposing respective top surfaces of the remaining horizontal portion 212-1 and the vertical portion 212-2), and exposes a recessed top surface 216R of the dielectric layer 216. When viewed from the top, in some embodiments, the recessed region 218 may surround the first dummy cylinder 206, the vertical portion 208-2 of the first electrode layer 208, the vertical portion 210-2 of the variable resistive material layer 210, and the vertical portion 212-2 of the second electrode layer 212.

In some embodiments, the recessed region 218 is formed by performing at least some of the following processes: performing a polishing process (e.g., a chemical-mechanical polishing (CMP) process) on respective portions of the dielectric layer 216, the isolation layer 214, the second electrode layer 212, the variable resistive material layer 210, and the first electrode layer 208 until a top surface 206T of the first dummy cylinder 206 is re-exposed; forming a patternable layer 220 (e.g., a photoresist layer) with plural openings 221 as shown in FIG. 2I; while using the patternable layer 220 as a mask, performing one or more dry etching processes to remove a portion of the isolation layer 214 that overlays the concave portion 212TC and a portion of the dielectric layer 216 that is not covered by the patternable layer 220; and removing the patternable layer 220.

Figure 2J:
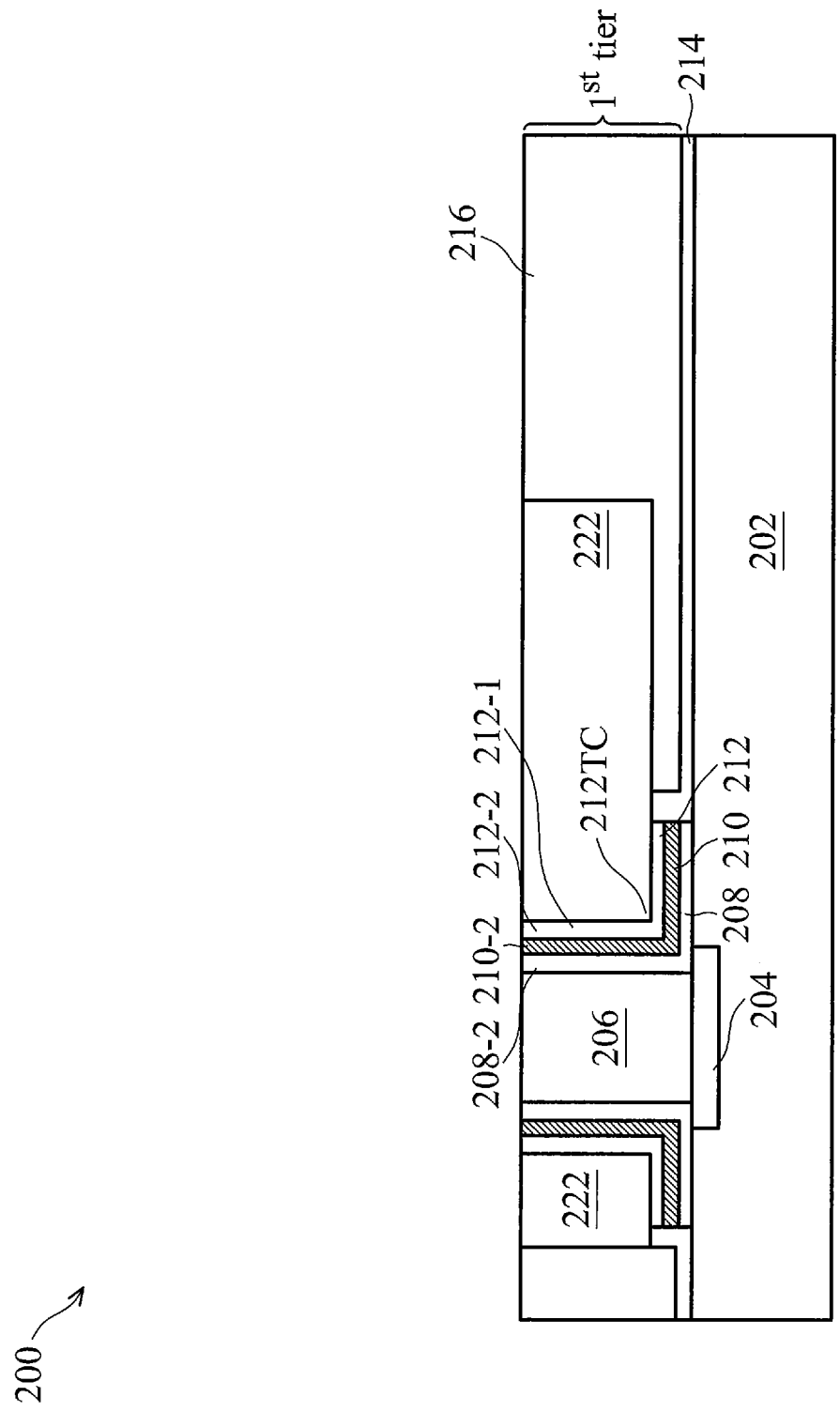

Corresponding to operation 120 of FIG. 1B, FIG. 2J is a cross-sectional view of the RRAM device 200 including a first electrode contact 222, which is formed, at one of the various stages of fabrication, according to some embodiments. In some embodiments, the first electrode contact 222 may be formed by refilling the recessed region 218 (FIG. 2I) by a metal material (e.g., copper (Cu)). As such, when viewed form the top, the first electrode contact 222 may surround the first dummy cylinder 206, the vertical portion 208-2 of the first electrode layer 208, the vertical portion 210-2 of the variable resistive material layer 210, and the vertical portion 212-2 of the second electrode layer 212, in accordance with some embodiments. Further, the first electrode contact 222 directly contact the second electrode layer 212 via the concave portion 212TC, i.e., directly contacting the remaining horizontal portion 212-1 and vertical portion 212-2 of the second electrode layer 212.

In some embodiments, after the first electrode contact 222 is formed, a first tier may be accordingly formed. Such a first tier includes a first partially formed RRAM resistor, which is formed by the first electrode layer 208, the variable resistive material layer 210, and the second electrode layer 212, and the first electrode contact 222. In the embodiment where the conductive feature 204 is formed in the dielectric material substrate 202, the first tier is disposed above the above-mentioned initial tier. As will be discussed in further detail below, the first electrode contact 222 may serve as one of two electrode contacts for the first partially formed RRAM resistor, and the first dummy cylinder 206 will be replaced with a metal material to serve as the other of the two electrode contacts such that a completed first RRAM resistor will be formed.

Figure 2K:
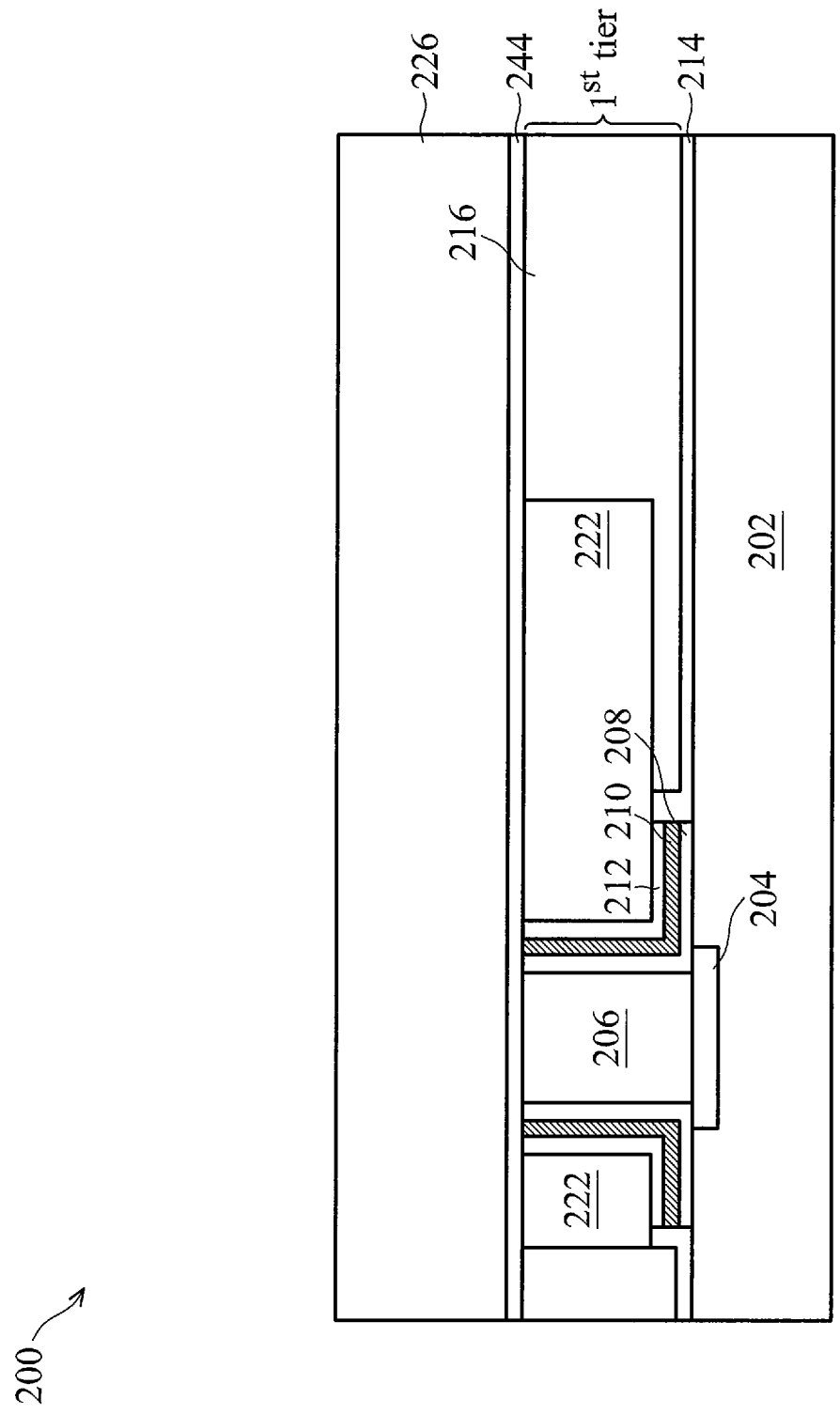

Corresponding to operation 122 of FIG. 1B, FIG. 2K is a cross-sectional view of the RRAM device 200 including a first inter-tier isolation layer 224 and a dummy layer 226, which is formed, at one of the various stages of fabrication, according to some embodiments. As shown, the first inter-tier isolation layer 224 is formed to overlay the first dummy cylinder 206, the first electrode layer 208, the variable resistive material layer 210, the second electrode layer 212, the first electrode contact 222, and the dielectric layer 216 (i.e., overlaying the whole first tier); and the dummy layer 226 is then formed to overlay the first inter-tier isolation layer 224.

In some embodiments, the first inter-tier isolation layer 224 is formed of a material that is substantially similar to the material of the isolation layer 214; and the dummy layer 226 is formed of a material that is substantially similar to the material of the first dummy cylinder 206. Thus, discussions of the materials of the first inter-tier isolation layer 224 and the dummy layer 226 are not repeated here. In some embodiments, the first inter-tier isolation layer 224 and the dummy layer 226 are respectively formed using a chemical vapor deposition (CVD) technique such as a plasma enhanced (PE) CVD, a high-density plasma (HDP) CVD, an inductively-coupled-plasma (ICP) CVD, or a thermal CVD technique.

Figure 2L:
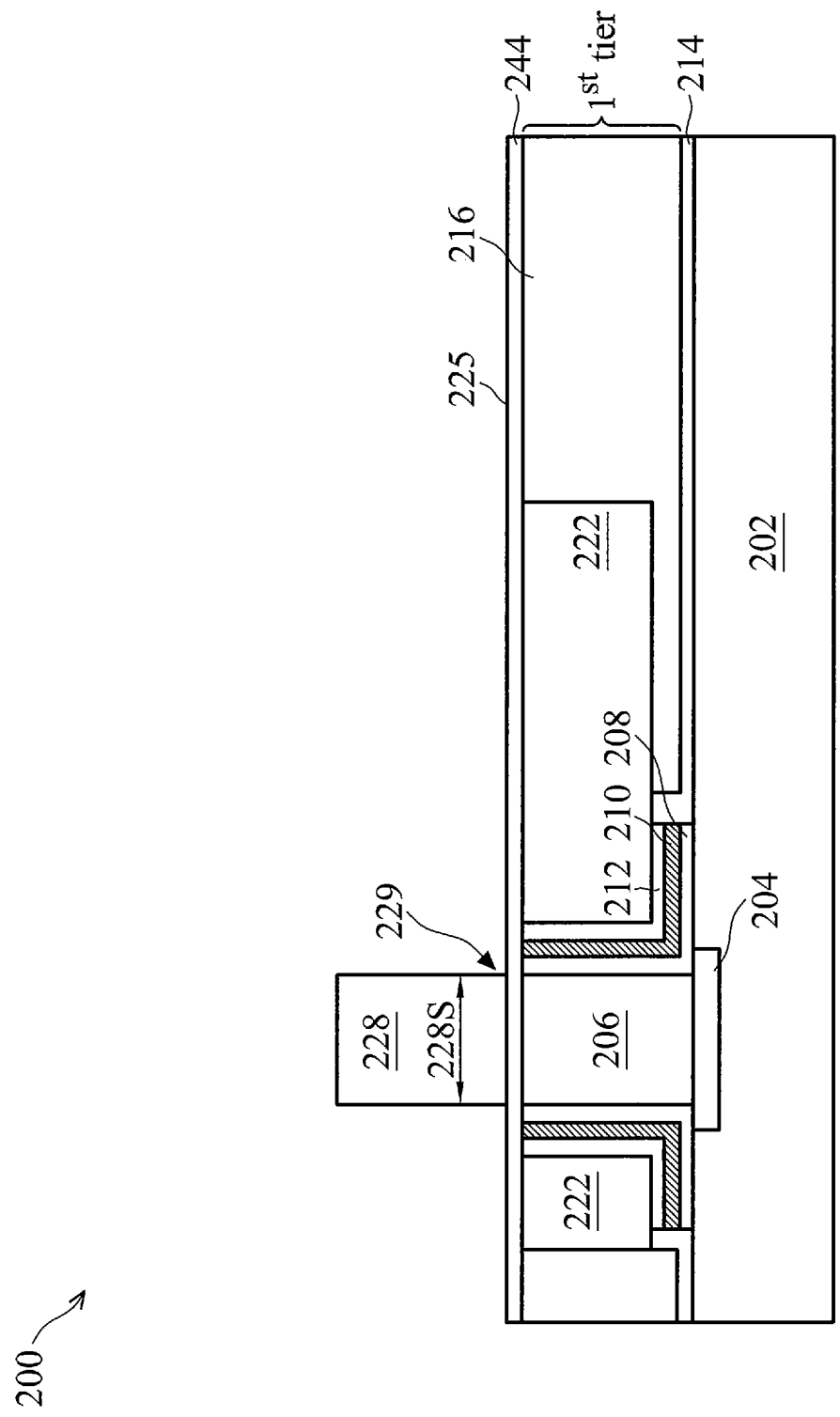

Corresponding to operation 124 of FIG. 1B, FIG. 2L is a cross-sectional view of the RRAM device 200 including a second dummy cylinder 228, which is formed, at one of the various stages of fabrication, according to some embodiments. As shown, the second dummy cylinder 228 protrudes beyond a major surface 225 of the first inter-tier isolation layer 224 and extends along the vertical direction, perpendicular to the major surface 225 of the first inter-tier isolation layer 224. Similarly, in some embodiments, a corner 229 may be formed at an intersection of a sidewall 228S of the second dummy cylinder 228 and the major surface 225 of the first inter-tier isolation layer 224. Further, in some embodiments, the second dummy cylinder 228 is laterally aligned with the first dummy cylinder 206.

In some embodiments, similar to the first dummy cylinder 206, the second dummy cylinder 228 may also include a cross-section in any of a variety of shapes, e.g., a circle, a polygon, etc. Alternatively stated, when viewed from the top, the second dummy cylinder 228 presents one of the above-mentioned shapes. Accordingly, in some embodiments, the corner 229, surrounding the second dummy cylinder 228, may follow the shape of the second dummy cylinder 228. In some embodiments, the second dummy cylinder 228 may have an aspect ratio (width/height) of about 0.01 to about 0.5. In an example where the second dummy cylinder 228 has a circular cross-section, the second dummy cylinder 228 may have a diameter of about 10 nm to about 70 nm, and a height of about 200 nm.

Figure 2M:
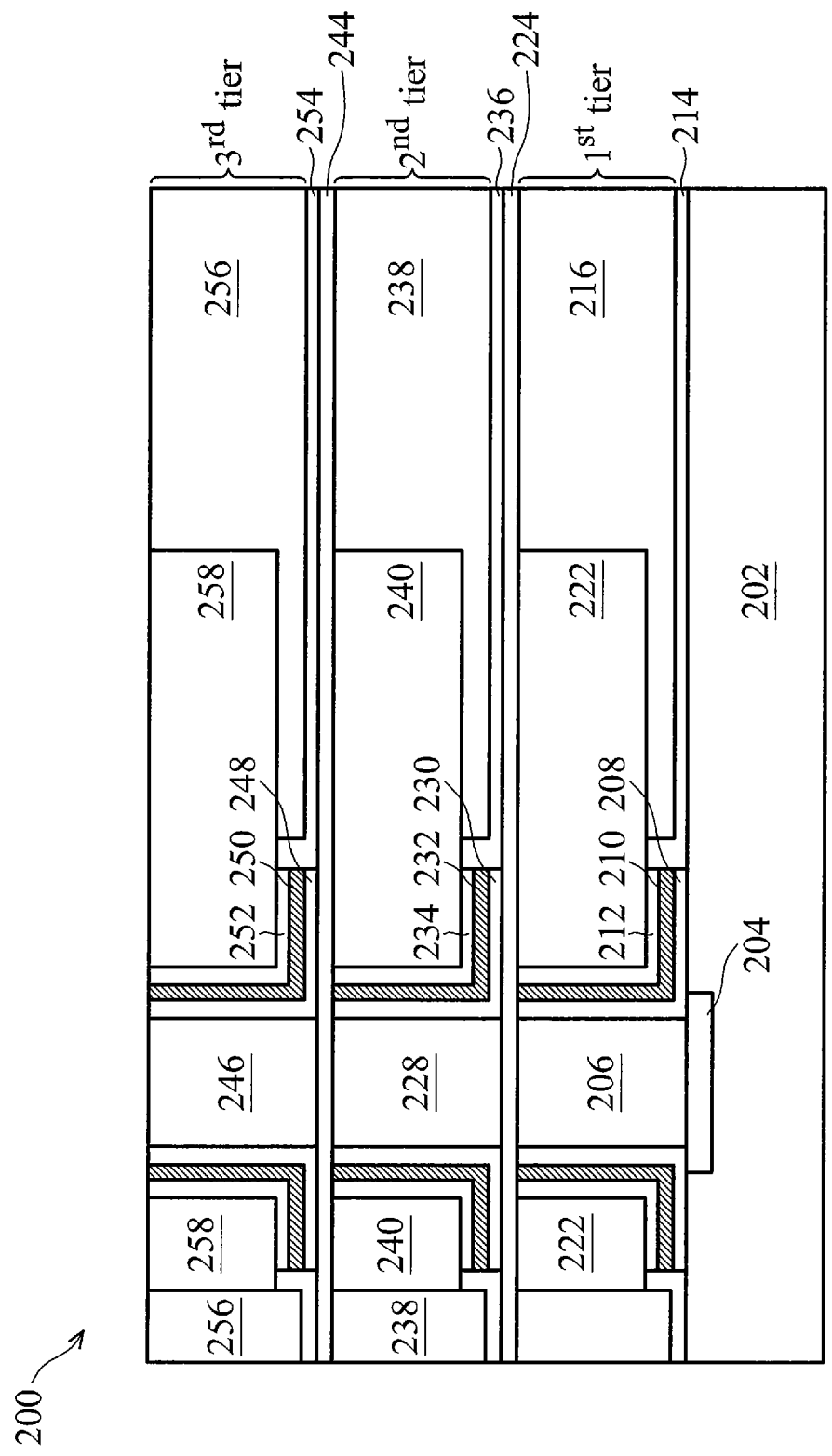

Corresponding to operation 126 of FIG. 1B in which the above-described operations 106 to 120 are repeated, FIG. 2M is a cross-sectional view of the RRAM device 200 including a second tier over the first tier and a third tier over the second tier at one of the various stages of fabrication, according to some embodiments. In some embodiments, when one iteration of the operations 106 to 124 is performed subsequently to formation of a respective dummy cylinder (e.g., 206, 228, etc.), an additional tier is formed. Since each of the additional tiers above the first tier (e.g., the second, the third tier, etc.) is substantially similar to the first tier, discussions of the second and third tiers are briefly discussed below.

In the illustrated embodiment of FIG. 2M, the second tier includes the second dummy cylinder 228 surrounded by respective first electrode layer 230, variable resistive material layer 232, and second electrode layer 234. The second tier further includes respective isolation layer 236, dielectric layer 238, and first electrode contact 240. As such, a second partially formed RRAM resistor, formed by the first electrode layer 230, the variable resistive material layer 232, the second electrode layer 234, and the first electrode contact 240 at the second tier, may be disposed at the second tier. Above the second tier, a second inter-tier isolation layer 244 is formed, and above the second inter-tier isolation layer 244, the third tier is formed. The third tier includes a third dummy cylinder 246 surrounded by respective first electrode layer 248, variable resistive material layer 250, and second electrode layer 252. The third tier further includes respective isolation layer 254, dielectric layer 256, and first electrode contact 258. As such, a third partially formed RRAM resistor, formed by the first electrode layer 248, the variable resistive material layer 250, the second electrode layer 252, and the first electrode contact 258 at the third tier, may be disposed at the third tier.

Figure 2N:
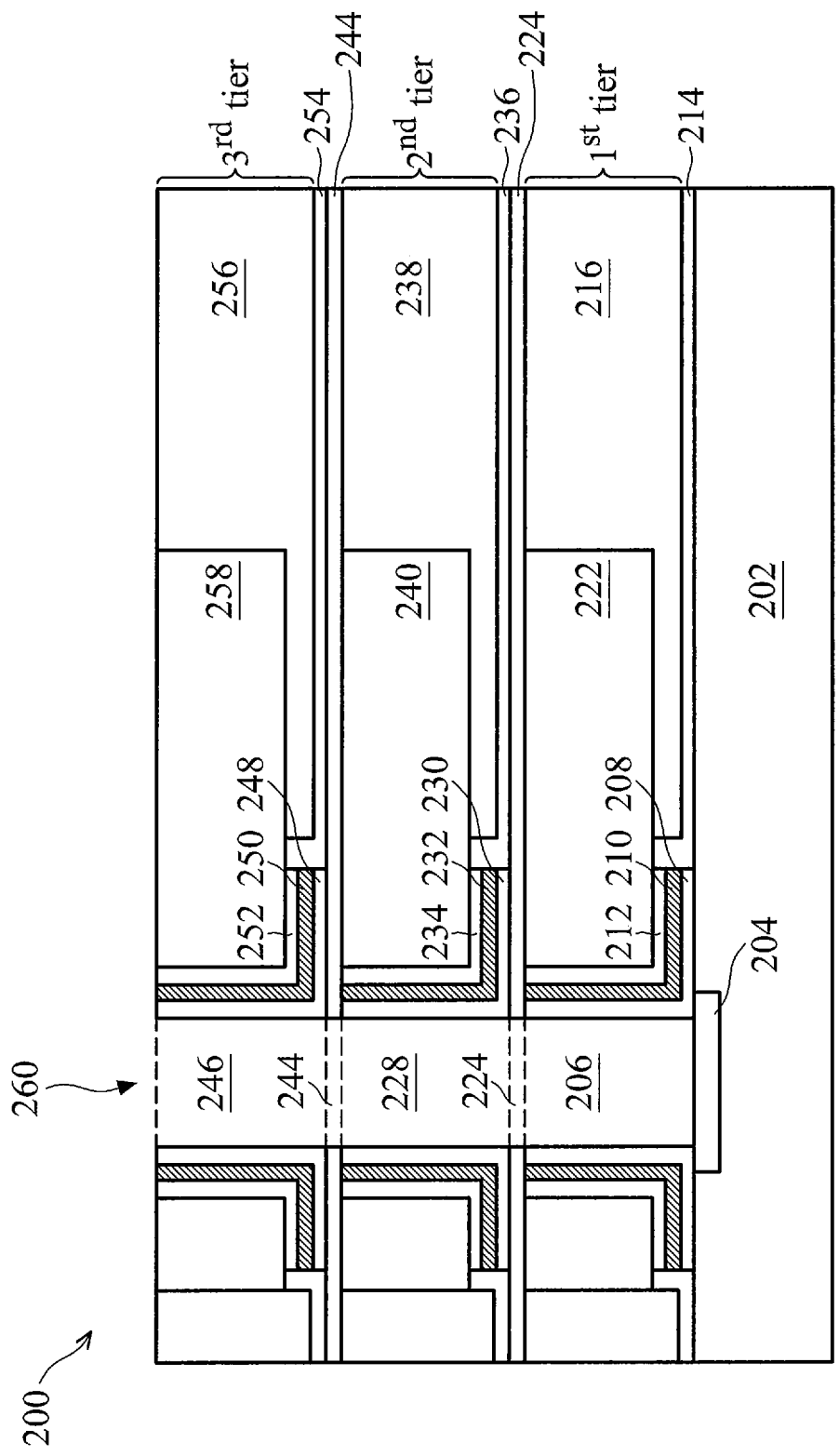
Figure 2O:
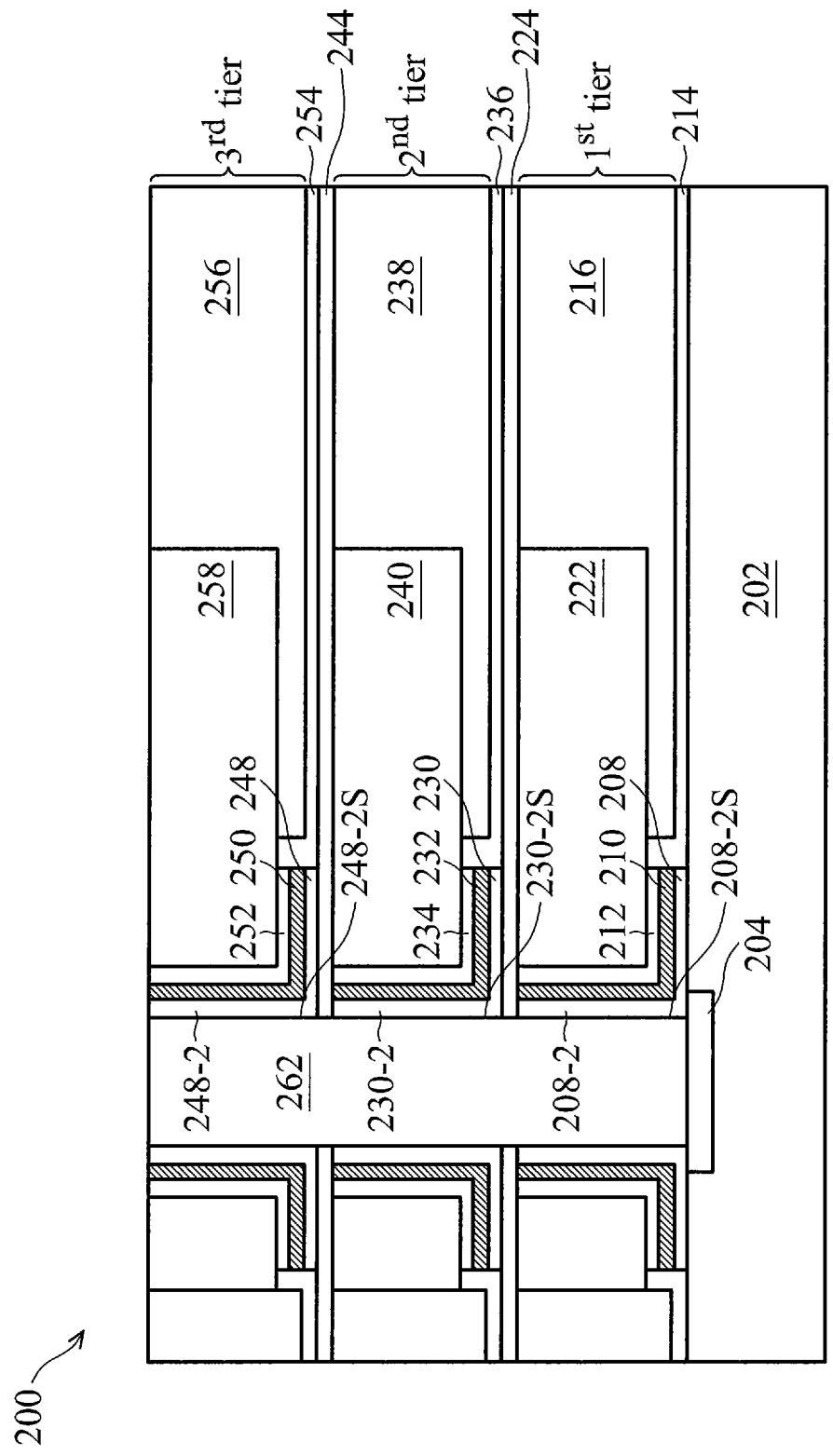

Corresponding to operation 128 of FIG. 1C, FIG. 2N is a cross-sectional view of the RRAM device 200 in which the first dummy cylinder 206, the second dummy cylinder 228, and the third dummy cylinder 246 are removed at one of the various stages of fabrication, according to some embodiments. As shown, a vertical trench 260 is formed after the removal of the first dummy cylinder 206, the second dummy cylinder 228, and the third dummy cylinder 246, and respective portions of the inter-tier isolation layers 224 and 244 (shown in dotted line).

In some embodiments, the third dummy cylinder 246 is removed using a first wet etching process, the portion of the inter-tier isolation layer 244 disposed beneath the third dummy cylinder 246 is removed using a first dry etching process, the second dummy cylinder 228 is removed using a second wet etching process, the portion of the inter-tier isolation layer 224 disposed beneath the second dummy cylinder 228 is removed using a second dry etching process, and the first dummy cylinder 206 is removed using a third wet etching process. As such, a top surface of the conductive feature 204 is re-exposed.

Corresponding to operation 130 of FIG. 1C, FIG. 2O is a cross-sectional view of the RRAM device 200 including a common electrode contact 262, which is formed, at one of the various stages of fabrication, according to some embodiments. As shown, the common electrode contact 262 is formed by refilling the vertical trench 260 (FIG. 2N) with a metal material (e.g., copper (Cu)) such that the common electrode contact 262 is electrically coupled to the conductive feature 204.

When viewed form the top, in accordance with some embodiments, the common electrode contact 262 may be surrounded by respective first electrode layer/variable resistive material layer/second electrode layer/first electrode contact at each tier. For example, at the first tier, the common electrode contact 262 is surrounded by the first electrode layer 208, the variable resistive material layer 210, the second electrode layer 212, and the first electrode contact 222; at the second tier, the common electrode contact 262 is surrounded by the first electrode layer 230, the variable resistive material layer 232, the second electrode layer 234, and the first electrode contact 240; and at the third tier, the common electrode contact 262 is surrounded by the first electrode layer 248, the variable resistive material layer 250, the second electrode layer 252, and the first electrode contact 258.

Further, in accordance with some embodiments, the common electrode contact 262 directly contacts a respective inner sidewall of the first electrode layer, or more specifically, an inner sidewall of a respective vertical portion of the first electrode layer, at each tier. For example, at the first tier, the common electrode contact 262 directly contacts an inner sidewall 208-2S of the vertical portion 208-2 of the second electrode layer 208; at the second tier, the common electrode contact 262 directly contacts an inner sidewall 230-2S of a vertical portion 230-2 of the second electrode layer 230; and at the third tier, the common electrode contact 262 directly contacts an inner sidewall 248-2S of a vertical portion 248-2 of the second electrode layer 248.

As such, a first completed RRAM resistor, formed by a respective portion of the common electrode contact 262, first electrode layer 208, variable resistive material layer 210, second electrode layer 212, and first electrode contact 222, is disposed at the first tier; a second completed RRAM resistor, formed by a respective portion of the common electrode contact 262, first electrode layer 230, variable resistive material layer 232, second electrode layer 234, and first electrode contact 240, is disposed at the second tier; and a third completed RRAM resistor, formed by a respective portion of the common electrode contact 262, first electrode layer 248, variable resistive material layer 250, second electrode layer 252, and first electrode contact 258, is disposed at the third tier.

In some embodiments, at a circuit-design level, the common electrode contact 262 may be coupled to a bit line (BL), and the first electrode contacts 222/240/258 at respective tiers that belong to respective different RRAM resistors are each coupled to a respective transistor, which is also known as a selection transistor. As such, plural 1-transistor-1-resistor (1T1R) RRAM bit cells may be formed, as illustrated in FIG. 3.

Figure 3:
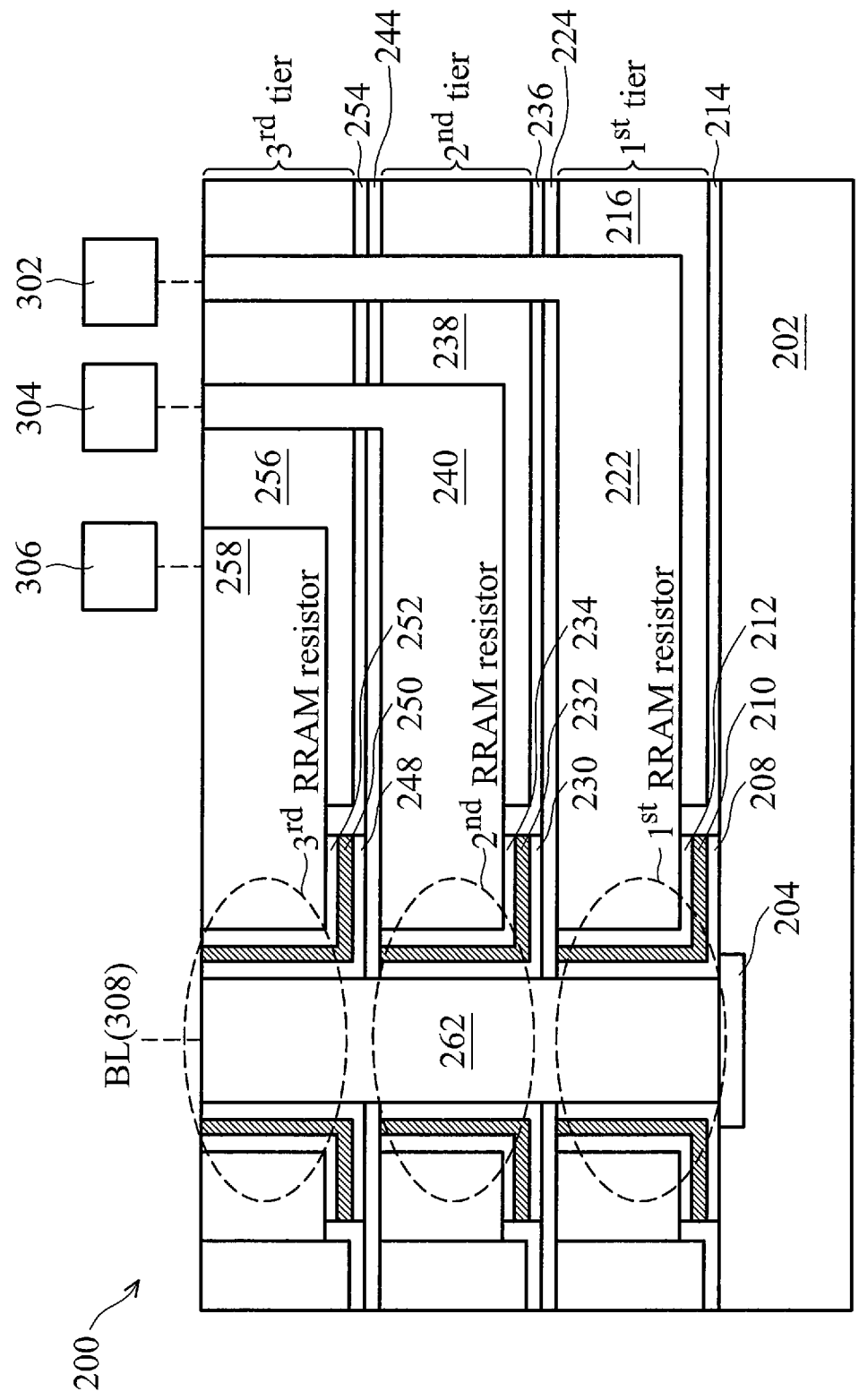
FIG. 3 illustrates an example in which the exemplary semiconductor device of FIGS. 2A-2O is coupled to one or more transistors, in accordance with some embodiments.

In particular, FIG. 3 reproduces the RRAM device 200 of FIG. 2O except that the first electrode contact 222 at the first tier further vertically extends through the second and third tiers to couple a respective selection transistor 302; the first electrode contact 240 at the second tier further vertically extends through the third tier to couple a respective selection transistor 304; and the first electrode contact 258 at the third tier further extends to couple a respective selection transistor 306. In some embodiments, the first RRAM resistor is coupled to a BL 308 through the common electrode contact 262, and coupled to a drain or source feature of the selection transistor 302 through the first electrode contact 222, which forms a first 1T1R RRAM bit cell. Similarly, the second RRAM resistor is coupled to the BL 308 through the common electrode contact 262, and coupled to a drain or source feature of the selection transistor 304 through the first electrode contact 240, which forms a second 1T1R RRAM bit cell; and the third RRAM resistor is coupled to the BL 308 through the common electrode contact 262, and coupled to a drain or source feature of the selection transistor 306 through the first electrode contact 258, which forms a third 1T1R RRAM bit cell.

Although, in FIG. 3, the selection transistors 302, 304, and 306 are illustrated as being disposed above the tiers, it is merely for illustration purposes. In some embodiments, such selection transistors 302, 304, and 306 may be formed below the tiers where the first, second, and third RRAM resistors are formed. Accordingly, the respective first electrode contacts 222/240/258 may be formed to further extend downwardly.

As mentioned above, in existing RRAM devices and methods forming the same, a maximum number of RRAM bit cells that can be integrated within a given area is limited because the RRAM bit cells can only be integrated two-dimensionally. In stark contrast, plural RRAM bit cells can be integrated into the disclosed RRAM device (e.g., 200) along an additional (e.g., vertical) direction through a common electrode contact (e.g., 262) so that a maximum number of RRAM bit cells that can be integrated within a given area may be substantially increased. Further, plural such vertically integrated RRM bit cells can be further integrated laterally through respective first electrode contacts (e.g., 222, 240, 258, etc.). As such, a total number of RRAM bit cells that can be integrated into the disclosed RRAM device may be further increased.

Figure 4:
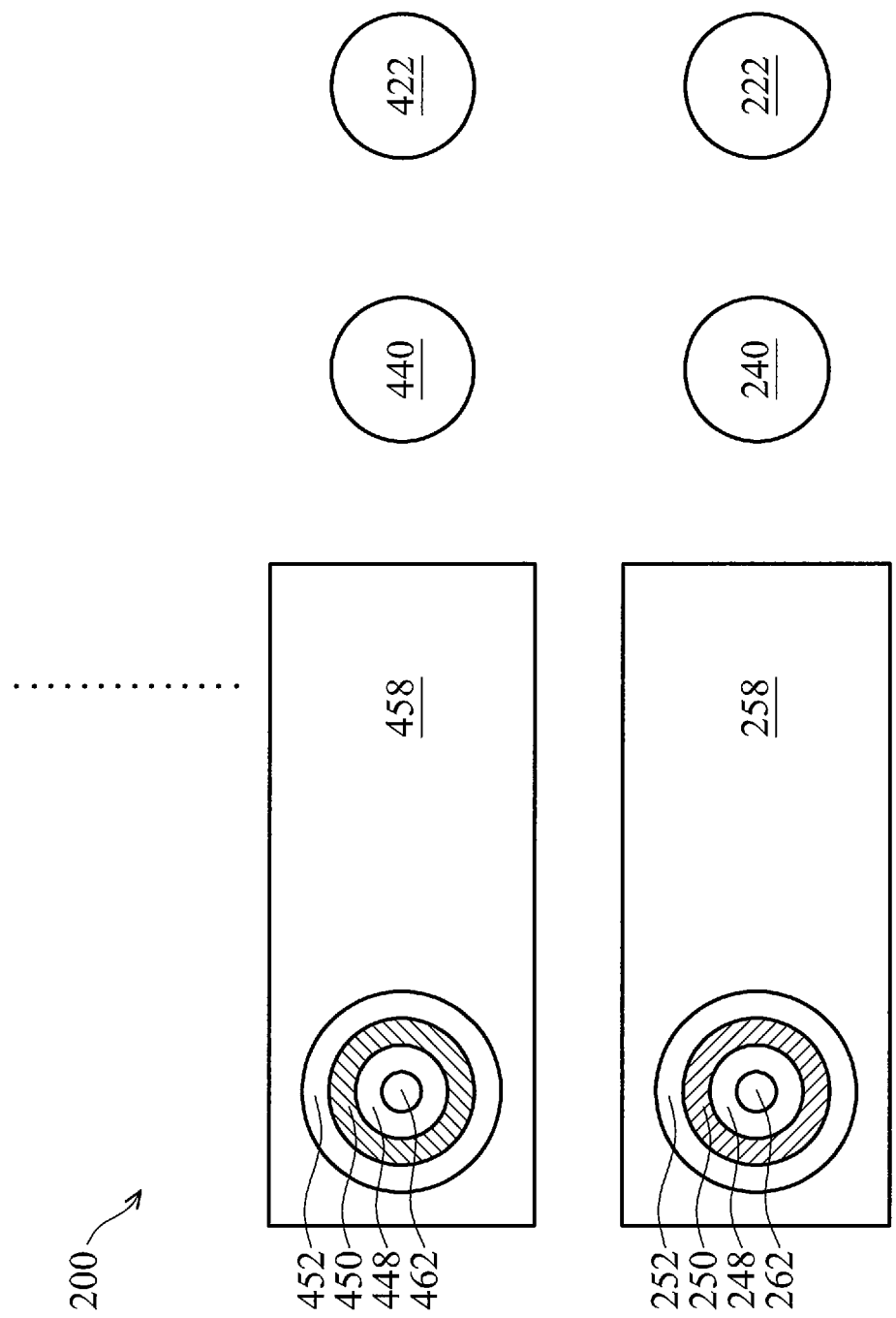
FIG. 4 illustrates a corresponding top view of the exemplary semiconductor device of FIG. 3, in accordance with some embodiments.

FIG. 4 illustrates a corresponding top view of the RRAM device 200 shown in FIG. 3, in accordance with some embodiments. It is noted that the top view of FIG. 4 is simplified for illustration purposes such that only top views of the RRAM resistor of the RRAM bit cells at the third tier and respective first electrode contacts of the RRAM resistors of the RRAM bit cells at the lower tiers are shown. In the illustrated embodiment of FIG. 4, the third RRAM resistor (the common electrode contact 262, first electrode layer 248, variable resistive material layer 250, second electrode layer 252, and first electrode contact 258), the first electrode contact 240 of the second RRAM resistor, and the first electrode contact 222 of the first RRAM resistor are arranged along a first row. It is understood that such a row can be repeatedly formed across the RRAM device 200 so as to form an RRAM array. For example, a second row, which includes a common electrode contact 462, first electrode layer 448, variable resistive material layer 450, second electrode layer 452, and first electrode contact 458, as well as a first electrode contact 440 and a first electrode contact 422 may be formed as shown in FIG. 4.

Figure 5:
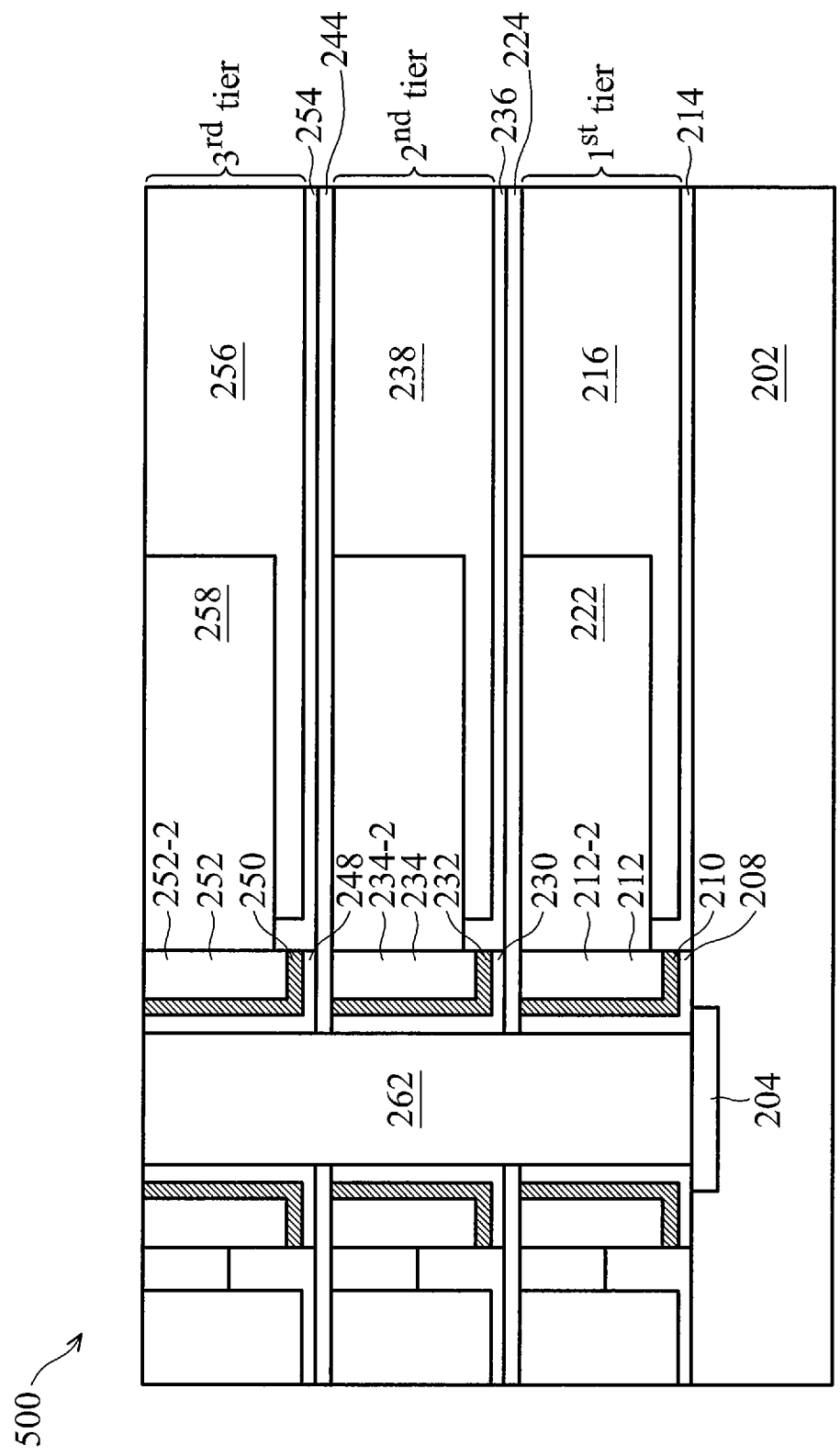
FIG. 5 illustrates an alternative structure of the exemplary semiconductor device of FIGS. 2A-2O, in accordance with some embodiments.

FIG. 5 illustrates an alternative structure of the RRAM device 200 as shown in FIG. 2O. For clarity, the alternative structure of the RRAM device 200 is herein referred to as a "RRAM device 500." As shown, the RRAM device 500 is substantially similar to the RRAM device 200 except that the second electrode layer 212/234/252 at each tier has only the respective vertical portion 212-2/234-2/252-2.

In an embodiment, a memory cell includes: a first electrode contact formed as a cylinder shape that extends along a first direction; a resistive material layer comprising a first portion that extends along the first direction and surrounds the first electrode contact; and a second electrode contact coupled to the resistive material layer, wherein the second electrode contact surrounds the first electrode contact and the first portion of the resistive material layer.

In another embodiment, a memory cell includes: a first electrode contact formed as a cylinder shape that extends along a first direction; a resistive material layer surrounding the first electrode contact, wherein the resistive material layer comprises a first portion that extends along the first direction and a second portion that extends along a second direction; and a second electrode contact surrounding the resistive material layer, wherein the second electrode contact is coupled to both the first and second portions of the resistive material layer.

In yet another embodiment, a memory device includes: a first memory cell and a second memory cell share a common electrode contact, wherein the first memory cell comprises: a first portion of the common electrode contact; a first resistive material layer comprising a first portion surrounding the first portion of the common electrode contact; and a first electrode contact comprising at least a portion surrounding the first portion of the common electrode contact and the first portion of the first resistive material layer, and wherein the second memory cell comprises: a second portion of the common electrode contact; a second resistive material layer comprising a first portion surrounding the second portion of the common electrode contact; and a second electrode contact comprising at least a portion surrounding the second portion of the common electrode contact and the first portion of the second resistive material layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of making a memory cell, comprising:
   forming a first electrode contact that extends along a first direction;
   forming a resistive material layer comprising a first portion that extends along the first direction and surrounds at least a portion of the first electrode contact;
   forming a second electrode contact, wherein the second electrode contact surrounds the first electrode contact and the first portion of the resistive material layer; and
   forming a transistor, wherein each of the first electrode contact and the second electrode contact is coupled to a drain feature or a source feature of the transistor.

2. The method of claim 1, wherein the first electrode contact is formed in the shape of a cylinder extending along the first direction and the resistive material layer presents a variable resistance value.

3. The method of claim 1, wherein the resistive material layer further comprises a second portion that extends along a second direction substantially perpendicular to the first direction.

4. The method of claim 3, wherein the second portion of the resistive material layer surrounds the first electrode contact.

5. The method of claim 4, wherein the second electrode contact extends along the second direction and is coupled to both the first and second portions of the resistive material layer.

6. The method of claim 1, further comprising:
   forming a first electrode layer comprising at least a portion that is disposed between the first electrode contact and the first portion of the resistive material layer; and
   forming a second electrode layer comprising at least a portion that is disposed between the first portion of the resistive material layer and the second electrode contact.

7. The method of claim 6, wherein the portion of the first electrode layer and the portion of the second electrode layer each extends along the first direction.

8. The method of claim 6, wherein the first electrode layer and the second electrode layer comprises conductive materials, wherein each of the thickness of the first electrode layer and the second electrode layer is in a range of 20-50nanometers.

9. A method of making memory cell comprising:
   forming a first electrode contact that extends along a first direction;
   forming a resistive material layer surrounding the first electrode contact, wherein the resistive material layer comprises a first portion that extends along the first direction and a second portion that extends along a second direction;
   forming a second electrode contact surrounding the resistive material layer, wherein the second electrode contact is coupled to both the first and second portions of the resistive material layer; and
   forming a transistor, wherein the second electrode contact is coupled to a drain feature or a source feature of the transistor.

10. The method of claim 9, wherein the second direction is substantially perpendicular to the first direction.

11. The method of claim 9, wherein the resistive material layer presents a variable resistance value.

12. The method of claim 9, wherein the second electrode contact extends along the second direction.

13. The method of claim 9, further comprising:
   forming a first electrode layer comprising a vertical portion that is disposed between the first electrode contact and the first portion of the resistive material layer, and a horizontal portion that is disposed between the second portion of the resistive material layer and a substrate; and
   forming a second electrodee layer comprising a vertical portion that is disposed between the first portion of the resistive material layer and the second electrode contact, and a horizontal portion that is disposed between the second portion of the resistive material layer and the second electrode contact.

14. The method of claim 13, wherein the first electrode layer and the second electrode layer comprises conductive materials, wherein each of the thickness of the first electrode layer and the second electrode layer is in a range of 20-50 nanometers.

15. A method of making a memory device, comprising:
   forming a first memory cell and a second memory cell, wherein the first and second memory cells share a common electrode contact,
   wherein forming the first memory cell comprises:
      forming a first portion of the common electrode contact;
      forming a first resistive material layer comprising a first portion surrounding the first portion of the common electrode contact; and
      forming a first electrode contact comprising at least a portion surrounding the first portion of the common electrode contact and the first portion of the first resistive material layer,
   and wherein forming the second memory cell comprises:
      forming a second portion of the common electrode contact;
      forming a second resistive material layer comprising a first portion surrounding the second portion of the common electrode contact; and
      forming a second electrode contact comprising at least a portion surrounding the second portion of the common electrode contact and the first portion of the second resistive material layer,
   wherein each of the first electrode contact and the second electrode contact is coupled to a drain feature or a source feature of first and second transistors, respectively.

16. The method of claim 15, wherein the first memory cell is disposed at a first tier, and second memory cell is disposed at a second tier above the first tier.

17. The method of claim 16, further comprising:
   forming an isolation layer disposed between the first and second tiers.

18. The method of claim 15, wherein the first and second resistive material layers each presents a variable resistance value.

19. The method of claim 15, wherein the common electrode contact, and the respective first portions of the first and second resistive material layers each extends along a first direction.

20. The method of claim 19, wherein the first and second resistive material layers each comprises a second portion extending along a second direction that is substantially perpendicular to the first direction.

* * * * *